(12) United States Patent
Melzer et al.

(10) Patent No.: US 8,269,947 B2
(45) Date of Patent: Sep. 18, 2012

(54) OPTICAL SYSTEM FOR SEMICONDUCTOR LITHOGRAPHY

(75) Inventors: Frank Melzer, Utzmemmingen (DE); Yim-Bun Patrick Kwan, Aalen (DE); Stefan Xalter, Oberkochen (DE); Damian Fiolka, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 674 days.

(21) Appl. No.: 12/372,095

(22) Filed: Feb. 17, 2009

(65) Prior Publication Data

US 2009/0207396 A1 Aug. 20, 2009

Related U.S. Application Data

(63) Continuation of application No. PCT/EP2007/007256, filed on Aug. 16, 2007.

(60) Provisional application No. 60/822,547, filed on Aug. 16, 2006.

(30) Foreign Application Priority Data

Aug. 16, 2006 (DE) .......................... 10 2006 038 455

(51) Int. Cl.
*G03B 27/68* (2006.01)
*G03B 27/54* (2006.01)

(52) U.S. Cl. ............................... 355/52; 355/67

(58) Field of Classification Search .................... 355/52, 355/53, 55, 67; 359/819–821
See application file for complete search history.

(56) References Cited

U.S. PATENT DOCUMENTS

| 4,804,978 | A  |   | 2/1989  | Tracy |
|-----------|----|---|---------|-------|
| 6,268,907 | B1 |   | 7/2001  | Samuels et al. |
| 6,879,381 | B2 |   | 4/2005  | Kenmoku |
| 7,474,384 | B2 | * | 1/2009  | Bleeker et al. ................ 355/67 |
| 7,580,207 | B2 | * | 8/2009  | Melzer ......................... 359/822 |
| 7,603,010 | B2 | * | 10/2009 | Kwan et al. ................... 385/52 |

(Continued)

FOREIGN PATENT DOCUMENTS

EP  1 672 431  6/2006

(Continued)

OTHER PUBLICATIONS

Office Action for corresponding U.S. Appl. No. 12/337,262, dated Nov. 14, 2011.

(Continued)

*Primary Examiner* — Hung Henry Nguyen
(74) *Attorney, Agent, or Firm* — Fish & Richardson P.C.

(57) ABSTRACT

An optical system for semiconductor lithography including a plurality of optical components, as well as related components and methods, are disclosed. The apparatus can include an optical component that can be moved by a distance along a straight line within a time of between 5 ms and 500 ms. The straight line can have a polar and azimuth angle of between 0° and 90°, and a distance between the straight line and an optical axis of the apparatus being less than a cross-sectional dimension of a projection exposure beam bundle of the projection exposure apparatus. The apparatus can also include a guide unit configured to guide the optical component. The apparatus can further include a drive unit configured to drive the optical component via drive forces so that torques generated by inertial forces of the optical component and of optional components concomitantly moved with the optical component, and the torques generated by the drive forces, which act on the guide unit, compensate for one another to less than 10%.

21 Claims, 10 Drawing Sheets

U.S. PATENT DOCUMENTS

| | | | |
|---|---|---|---|
| 7,692,884 B2 * | 4/2010 | Ishikawa | 359/819 |
| 7,791,826 B2 * | 9/2010 | Bieg et al. | 359/819 |
| 2003/0038937 A1 | 2/2003 | Sato | |
| 2003/0043356 A1 | 3/2003 | Shiraishi | |
| 2003/0197838 A1 | 10/2003 | Kohno | |
| 2006/0126049 A1 | 6/2006 | Deguenther et al. | |
| 2006/0285100 A1 * | 12/2006 | Hamatani et al. | 355/55 |
| 2009/0135395 A1 * | 5/2009 | Melzer et al. | 355/67 |
| 2009/0174877 A1 | 7/2009 | Mulder et al. | |
| 2009/0185148 A1 | 7/2009 | Kwan et al. | |
| 2009/0207396 A1 | 8/2009 | Melzer et al. | |

FOREIGN PATENT DOCUMENTS

| | | |
|---|---|---|
| JP | 09-082605 | 3/1997 |
| JP | 10-206714 | 8/1998 |
| JP | 11-121355 | 4/1999 |
| JP | 11-340138 | 12/1999 |
| JP | 2002-353105 | 12/2002 |
| JP | 2003-068622 | 3/2003 |
| JP | 2003-318087 | 11/2003 |
| JP | 2004-319770 | 11/2004 |
| JP | 2006-526276 | 11/2006 |
| JP | 2007-227918 | 9/2007 |
| JP | 2009-545152 | 12/2009 |
| WO | WO 2003/085456 | 10/2003 |

OTHER PUBLICATIONS

English translation of Japanese Office Action, for corresponding JP Appl No. 2009-524130, dated Nov. 16, 2011.

* cited by examiner

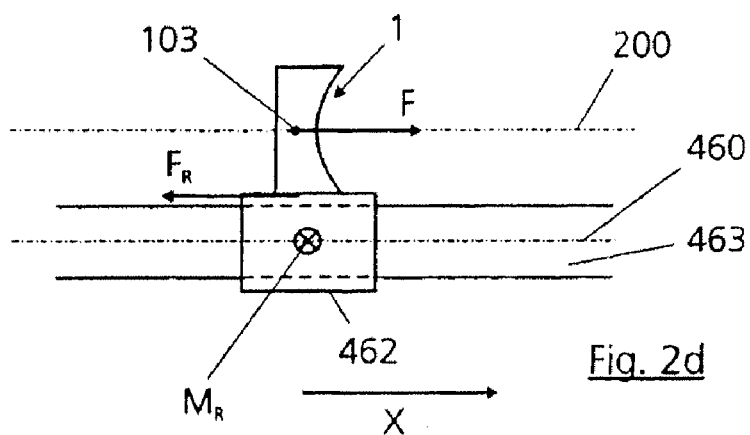
Fig. 2d
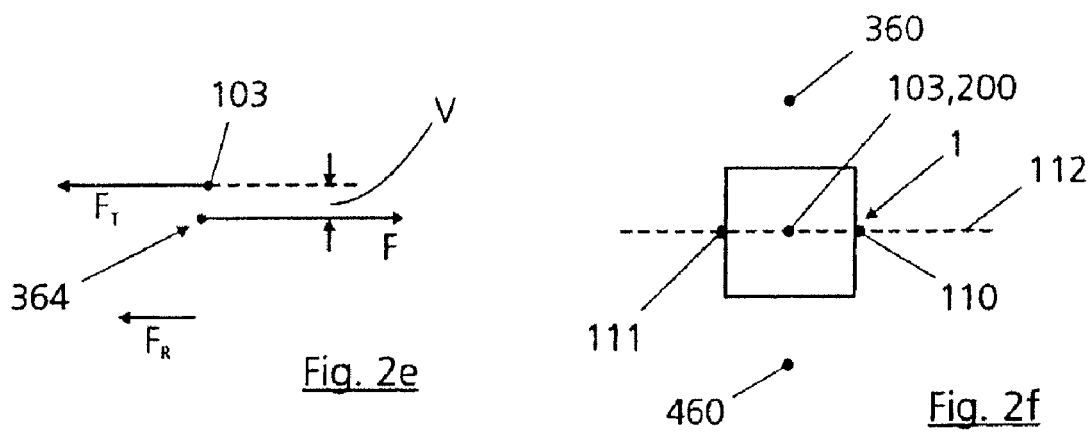
Fig. 2e
Fig. 2f
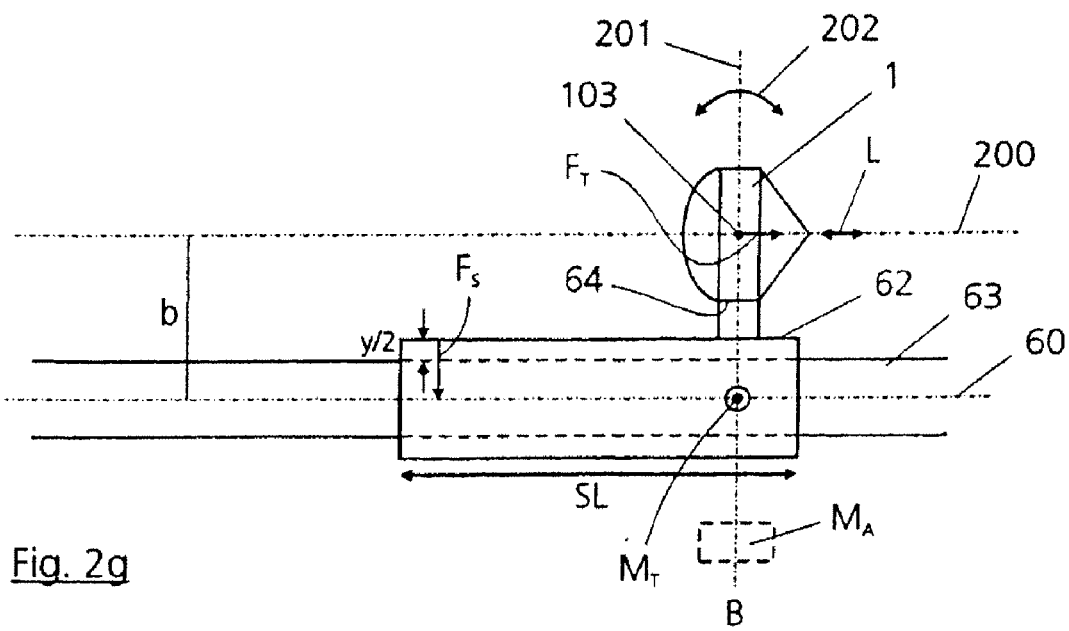
Fig. 2g

OPTICAL SYSTEM FOR SEMICONDUCTOR LITHOGRAPHY

CROSS-REFERENCE TO RELATED APPLICATIONS

This application is a continuation of, and claims benefit under 35 USC 120 to, international application PCT/EP2007/007256, filed Aug. 16, 2007, which claims benefit of U.S. Ser. No. 60/822,547, filed Aug. 16, 2006 and German Application No. 10 2006 038 455.5, filed Aug. 16, 2006. International application PCT/EP2007/007256 is hereby incorporated by reference.

FIELD

The disclosure relates to an optical system for semiconductor lithography including a plurality of optical components, as well as related components and methods.

BACKGROUND

Optical systems for semiconductor lithography can be flexibly set to a wide variety of operational configurations.

SUMMARY

In some embodiments, the disclosure provides a device and a method which permit the rapid changing of the operational configuration of an optical system for semiconductor lithography.

In one aspect, the disclosure provides an optical system configured to be used in semiconductor microlithography. The optical system includes a plurality of optical components and an actuating unit. The actuating unit is configured to position at least one of the plurality of optical components at defined positions along an optical axis of the optical system to set different operational configurations of the optical system. The actuating unit acts on the optical component at at least one point of action, and the actuating unit is configured so that it is possible to change between two different operational configurations within a time period of less than 500 ms.

In another aspect, the disclosure provides a method that includes changing between two different operational configurations of an optical system for semiconductor lithography in a time period of less than 50 ms by positioning at least one optical component of a plurality of optical components of the optical system along an axis of the optical system.

In a further aspect, the disclosure provides an illumination system for a projection exposure apparatus in semiconductor lithography. The illumination system includes an optical element configured to set a light distribution in a pupil plane of the system. The illumination system also includes a manipulable optical component arranged in a light path upstream of the optical element so that different regions of the optical element can be illuminated by manipulating the optical component.

In an additional aspect, the disclosure provides a lithographic projection exposure apparatus. The apparatus includes an optical component that can be moved by a distance along a straight line. The straight line has a polar and azimuth angle of between 0° and 90°. A distance between the straight line and an optical axis of the apparatus being less than a cross-sectional dimension of a projection exposure beam bundle of the projection exposure apparatus. The apparatus also includes a guide unit configured to guide the optical component. The apparatus further includes a drive unit configured to drive the optical component via drive forces so that torques generated by inertial forces of the optical component and of optional components concomitantly moved with the optical component, and the torques generated by the drive forces, which act on the guide unit, compensate for one another down to a magnitude of less than 10%.

In another aspect, the disclosure provides an illumination system for a projection exposure apparatus in semiconductor lithography. The illumination system includes an optical component configured to set a radiation distribution in a pupil plane of the system, the optical component comprising at least two optical partial elements. Each of the partial optical components is capable of being introduced periodically at a frequency into a beam bundle used to illuminate. The illumination system also includes a source of pulsed electromagnetic radiation configured to generate the beam bundle, a pulse frequency of the electromagnetic radiation corresponding to the frequency at which the partial elements are introduced into the beam bundle.

In some embodiments, the optical system for semiconductor lithography includes a plurality of optical components, where, for setting different operational configurations of the optical system, there is at least one actuating unit for positioning at least one optical component at defined positions along an optical axis of the optical system. In this case, the actuating unit acts on the optical component at at least one point of action and is designed so that it is possible to change between two different operational configurations within a time period of less than 500 ms (e.g., 50 ms). Appropriate optical components include all optical elements that are usually used in optical systems, such as, for example, lenses, mirrors, diaphragms, plane-parallel plates or else diffractive optical elements such as, for example, diffraction gratings, in each case with mounts, if appropriate.

The optical system can be, for example, an illumination system or else a projection objective of a lithographic projection exposure apparatus.

In some embodiments, the points of action of the actuating unit on the optical component are chosen in such a way that no moments arise on the optical component. In other words, as a result of the acceleration of the optical components during their movement for positioning, no torques or tilting moments take effect on the optical component. This means that only a linear acceleration is present at the optical component as a result. As soon as the optical component has reached the desired position, only the inertial forces resulting from the linear acceleration have to be compensated for in order to prevent or effectively attenuate a subsequent oscillation of the optical component. In this case, a linear acceleration encompasses positive accelerations, during which the kinetic energy of the optical component increases with respect to time, and also negative accelerations or decelerations, in which the kinetic energy of the optical component decreases with respect to time. By way of example, the linear acceleration of the optical component is provided shortly before reaching a desired end position via a retardation of the optical component. In this case, the forces of the actuating unit act on the optical component in such a way according to the disclosure that after vector addition of all the forces (including the inertial forces), no resultant torque having a component perpendicular to the acceleration takes effect on the optical component. Optionally, the resultant torque is zero, or less than 10% with regard to its magnitude, such as less than 1% of the magnitude of the maximum occurring individual torque generated by the forces (including inertial forces). In this case, the lower limit for the resultant torque also depends, inter alia, on the friction occurring in the actuating unit. As a result, this has the effect that the time required overall for positioning the optical component is significantly reduced by comparison with certain known times. This is because avoiding the resultant torque mentioned considerably reduces or completely prevents the oscillation excitation of the actuating unit and/or of a guide unit for the optical component (for the precise linear guidance thereof), by the movement of the optical component, such that possible oscillation amplitudes of the optical element do not affect the desired end position of the element. This affords the possibility of switching an optical system for semiconductor lithography from one operational configuration to another within extremely short time periods.

The optical component's freedom from moments during the adjusting process as outlined above can be achieved in this case by virtue of the fact that precisely one point of action of the actuating unit on the optical component is present, which is chosen in such a way that the vector of the force exerted on the optical component by the actuating unit at the point of action runs through the centroid of the optical component. By virtue of the fact that the actuating unit acts on the optical component only at one location and the vector of the force exerted on the optical component by the actuating unit runs through the centroid of the optical component, the required freedom from moments or the moment equilibrium can be ensured in a simple manner. This variant need not involve the force that is exerted on the optical component at different points by one or a plurality of actuating units to be apportioned in such a way that a moment equilibrium or a freedom from moments for the optical component arises as a result—this requirement is automatically fulfilled by the choice of the point of action and the direction of the force.

As a result of geometrical conditions of the device it may be appropriate to provide precisely two points of action of the actuating unit on the optical component. In this case, the desired mechanical behavior of the optical component can be achieved by virtue of the fact that the points of action are chosen in such a way that the centroid of the optical component lies on the area which is defined by a straight line through the two points of action and the vector of the resultant force acting on the optical component. In this case, the optical component can be moved at the points of action either by one actuating unit or by two actuating units for positioning. In this case, the use of just one actuating unit for positioning has the advantage that a coordination of the forces acting on the optical component at the points of action is already inherently ensured by this structural measure. Since only one actuating unit acts on the optical component, it is ensured that the forces acting at the two points of action are always in the same relationship with respect to one another, which is determined only by the geometry of the arrangement and not by the forces exerted by different actuating units. It goes without saying that the actuating unit can also act on the optical component via more than two points of action; in this case, it is merely necessary to ensure that no resultant torques or tilting moments arise at the optical component as a result.

In this case, it has proved worthwhile to embody the actuating unit in such a way that it has at least one Lorentz linear actuator. In this case, a Lorentz linear actuator is understood to be a linear motor in which a translational, linear movement is achieved directly on account of the force interaction between magnets that is based on the Lorentz force. In this case, the magnets can be realized as coils through which current flows, that is to say as electromagnets, or—in some instances—as permanent magnets. One advantage of using Lorentz linear actuators is that extremely rapid movements can be realized in a precise manner using the actuators. In this case, the Lorentz linear actuator operates practically contactlessly and hence in a manner free of wear and maintenance; furthermore, the force exerted by the Lorentz linear actuator is dependent only on the current flowing through the coils and not on the present actuator position. As a result, the use of the linear actuator permits the positioning of an optical component over travels of a few cm, such as in the region of 20 cm, with an accuracy in the µm range within a time period of less than 500 ms, such as less than 50 ms.

For the case where the Lorentz linear actuator has permanent magnets, it is advantageous if the magnets are mechanically connected to the optical component. The arrangement of the permanent magnets on the optical component has the advantage that the desire for a cabling of the optical component to be moved, as would be necessary in the case of using coils through which current flows, is effectively avoided in this way and the mobility of the optical component is therefore not restricted by the cabling as a result. This variant is advantageous particularly for those cases where the optical component is intended to be positioned over a longer path, in particular in the region of greater than 50 mm.

For cases where the optical component is positioned over a shorter path, it can also be advantageous if the Lorentz linear actuator has coils that are mechanically connected to the optical component. Although this procedure has the implication that the electrical cables required for making contact with the coils have to be concomitantly moved, this procedure has the advantage that the coils used usually have a smaller weight than the permanent magnets, such that the inertial forces resulting from the accelerations of the optical component are lower than in the case of using permanent magnets.

The technical characteristics of the Lorentz linear actuator as outlined above make it possible for at least one Lorentz linear actuator to be designed to position a plurality of optical components. Via suitable driving of the coils through which current flows, it is possible in this case to achieve a mutually independent movement of different optical components via the same Lorentz linear actuator. The apparatus outlay and hence the complexity of the overall system can be effectively limited in this way.

For guiding the movement of the optical component during the positioning, a linear guide has proved to be worthwhile, which guide can be a rolling bearing guide or as an aerostatic bearing, such as a gas bearing, air bearing or air cushion bearing. In this case, the linear guide ensures that the optical element, during its positioning, does not experience an offset or tilting with respect to the optical axis of the optical system. The use of a linear guide with rolling bearings—as ball recirculation or cross roller guide—has the advantage that a guide of this type can be realized in very stiff fashion.

The functioning of an aerostatic bearing is based on the fact that two elements moved relative to one another are separated by a thin gas film and therefore do not come into mechanical contact with one another. In this way, the elements are enabled to be moved relative to one another in a manner exhibiting very little wear and friction, whereby particle abrasion that leads to contaminations can also be avoided. In this case, the gas film can be established dynamically by feeding in gas. The purge gas—generally nitrogen—used anyway in optical systems for semiconductor lithography can advantageously be employed as the gas.

An encoder having a measuring head and a reference grating can be used for determining the position of the optical component. In this case, the reference grating can be realized as a line grating structure on a plastic film adhesively bonded onto the optical component. The measuring head registers the number of lines passing it during a movement of the optical component and derives the position of the optical component therefrom. It goes without saying that it is also conceivable for the measuring head to be arranged on the optical component; this is advantageous primarily when the structural space is greatly restricted in an axial direction.

A compensation device can be employed for the compensation of the weight force acting on the optical component, the compensation device being realized for example as a counterweight or as a frictionless pneumatic cylinder with gap seals. This variant has the advantage that it is possible to avoid contamination of the interior of the optical system by escaping gas. The compensation of the weight force has the effect that in the rest state the optical component does not have to be held by the actuating unit against the weight force and heating of the actuating unit in the rest state is thus prevented.

The actuating unit can be designed so that it includes an axial actuating mechanism for positioning the optical component in a direction of an optical axis of the optical system and a pivoting mechanism for pivoting the optical component out of or into the beam path of the optical system. It goes without saying that it is also conceivable for only the pivoting mechanism to be connected, and for a movement of the optical component in an axial direction not to be provided. This measure has the effect that optical components, as long as they are situated outside the beam path of the optical system, can be brought ready to the axial position at which they are intended to be situated in a new operational configuration of the optical system. In this case, the axial positioning of the optical components can already be effected during the operation of the optical system in the old operational configuration; for setting the new operational configuration it then suffices merely to pivot the relevant optical components into the beam path of the optical system, thus reducing the time required for changing from one operational configuration to the next. For this purpose, it is advantageous if the pivoting mechanism and the axial actuating mechanism are designed so that there is a free travel of the optical component in an axial direction if the optical component is pivoted out of the beam path of the optical system.

Since a comparatively long time, usually between one and six seconds, is available on account of the variant outlined above for the axial positioning of the optical components, the requirements made of the axial actuating mechanism are comparatively moderate. They can be spindle drives, Lorentz linear actuators, toothed racks or else cable pulls.

In this case, the pivoting mechanism can a rotatable element; the centroid of the arrangement of pivoting mechanism and optical component can advantageously be arranged in the region of the axis of rotation of the pivoting mechanism; rotational oscillations of the optical component can be avoided particularly effectively in this way. If the centroid is on the axis of rotation, then the sum of the centrifugal or centripetal forces is advantageously zero. As a result, the axis of rotation is not burdened by a possible unbalance. An oscillation excitation of the axis of rotation and thus also an oscillation excitation of the optical element or of the optical component are thus effectively avoided, whereby a precise positioning of the optical component within a very short time becomes possible. Furthermore, it is advantageous to design the pivoting mechanism in stiff and lightweight fashion for avoiding oscillations. Materials having a large modulus of elasticity with low density, that is to say for example titanium alloys or else carbon fiber composite materials, are appropriate for realizing the pivoting mechanism. Because only individual optical components are pivoted into the beam path of the optical system, the accelerated masses and hence the resultant inertial forces are small—also on account of the aforementioned choice of the materials for the pivoting mechanism—, such that fast movements can be realized without excessively severe oscillations of the device occurring. In this case, the pivoting operation mentioned is effected within 500 ms, such as within 50 ms, in modern lithography apparatuses within 10 ms. It should be mentioned that it is also possible for more than one optical component to be pivoted into the beam path, or with the pivoting of an optical component or a group of optical components into the beam path of a lithographic projection exposure apparatus it is possible at the same time for at least one other optical component to be pivoted out of the beam path. Thus, e.g. just by pivoting optical components into and out of the beam path of a projection exposure apparatus for example in a zoom axicon system, it is possible to obtain two different configurations with regard to the illumination setting respectively arising.

For rapidly pivoting the optical components into the beam path it has proved worthwhile to embody the pivoting mechanism in such a way that they have a prestress element and a releasable retention element. It is thus possible to establish a prestress relative to the retention element even before the optical component is pivoted into the beam path; after the release of the retention element, the full force is then immediately present at the optical component, which can then be introduced rapidly into the beam path. In this case, the prestress element can be realized as an electromagnet, for example.

As a further variant of the arrangement according to the disclosure, at least two actuating units having in each case at least one axial actuating mechanism and in each case at least one pivoting mechanism assigned to the axial actuating mechanism can be present. In this case, the optical components that can be positioned by the actuating units can be substantially identical or else different with regard to their optical properties. The coupling of the optical component(s) to the actuating units can be effected in such a way that, as illustrated above, the oscillation excitation of actuating units and/or guide units for guiding the optical component, such as e.g. the axis of rotation, are minimal.

In a further advantageous variant of the disclosure, at least one of the optical components has a centering tolerance within the range of between 30 µm and 60 µm. The centering tolerance of the relevant optical component to be positioned is thus higher than the centering tolerance of the optical components fixedly incorporated in the optical system. The higher centering tolerance of the optical components to be positioned can be achieved for example by a corresponding rebudgeting in the design of the optical system. As a result of the higher centering tolerance of the optical components to be positioned, the requirements made of the actuating unit and the mechanisms assigned thereto decrease, thus reducing the outlay in the construction and realization of the device according to the disclosure.

As a further possibility, e.g. for the case where the optical component is mounted such that it is pivotable or rotatable with respect to a bearing point, the optical component can be mechanically connected to a balancing mass in order to reduce parasitic forces/moments. In this case, the balancing mass can have a larger mass than the mass of the optical component, which can be compensated for by virtue of the fact that the distance between the centroid of the balancing mass and the bearing point is less than the distance r between the centroid of the optical component and the bearing point. The balancing mass can itself again be formed by an optical component.

The disclosure described above can advantageously be used in an illumination system for a projection exposure apparatus in semiconductor lithography. In this case, the illumination system can include an optical element, e.g. a micromirror array, which can serve for setting a light distribution in a pupil plane of the illumination system. For setting or for supporting the setting of the light distribution, a manipulable optical component is arranged in the light path upstream of the optical element in such a way that different regions of the optical element, such as e.g. of the micromirror array, can be illuminated by a manipulation of the optical component.

The manipulable optical component can be a mirror which is movable, such as displaceable or tiltable, in the light path. It is likewise possible to use a diffractive optical element which can be introduced, such as inserted, into the light path, a conical lens of an axicon or a refractive optical component.

In addition, it is advantageous if optically active elements for polarization rotation are arranged in the light path upstream of the optical element, which elements can be used to set different polarizations for the different regions of the optical element; the arrangement of at least one neutral filter in the light path upstream of the optical element is also conceivable.

Some exemplary embodiments of the disclosure are explained in more detail below with reference to the drawings.

IN THE FIGURES

FIG. 2d shows an embodiment according to FIG. 2c taking account of friction in the guide device;

FIG. 2e shows a schematic illustration of the forces that occur in an embodiment according to FIG. 2c taking account of the friction according to FIG. 2d;

FIG. 2f shows a further embodiment of the disclosure with drive forces acting on the edge of the optical component;

FIG. 2g shows a further embodiment of the disclosure;

FIGS. 5a-5b show two embodiments of the device according to the disclosure in which the weight force of the optical component is compensated for;

Figure 1:
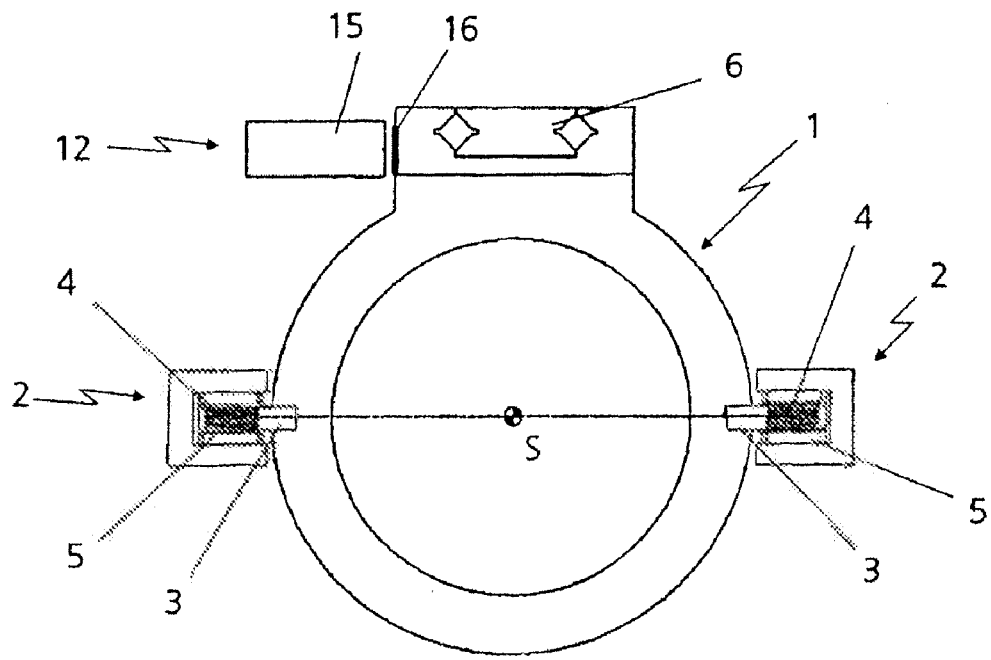
FIG. 1 shows a device according to the disclosure.

FIG. 1 shows a device according to the disclosure. In this case, the optical component 1 is moved via the actuating units 2 along the optical axis, which in the present case runs perpendicular to the plane of the drawing. In the present case, the two actuating units 2 are realized as Lorentz linear actuators with permanent magnets 4 and coils 5; in this case, the permanent magnets 4 are mechanically connected to the optical component 1 via a respective point of action 3. As indicated in FIG. 1, in this case the straight line through the two points of action 3 runs through the centroid—designated by "S"—of the optical component 1. This arrangement of the points of action has the advantage that, assuming an at least approximately identical behavior of the actuating units 2, the optical component 1 can be moved without torques acting on it. What is achieved in this way is that oscillations of the optical component 1 during or after the positioning, which oscillations could originate from such torques, cannot arise. As a result this provides a possibility of moving the optical component 1 very rapidly along the optical axis to the desired position in the optical system, since, firstly, the time period required for the optical component 1 to come to rest after reaching its position in the optical system is significantly shortened and, secondly, overall higher speeds become possible for the positioning of the optical component 1. In this case, the movement of the optical component 1 along the optical axis is stabilized by the linear guide 6 and measured by the displacement measuring system 12. The displacement measuring system 12 can be a so-called encoder whose measuring head 15 is fixedly connected to the housing (not illustrated in FIG. 1) of the optical system and whose reference grating 16 is concomitantly moved with the optical component 1; it is likewise conceivable to arrange the measuring head 15 on the optical component 1 and to fixedly connect the reference grating 16 to the housing of the optical system. The second variant is advantageous particularly when little structural space is available in an axial direction. Instead of an encoder measuring system, it is alternatively possible to use a different position detecting system if the latter has the required accuracy. A position detecting system is ideally used for each Lorentz linear actuator.

Figure 2:
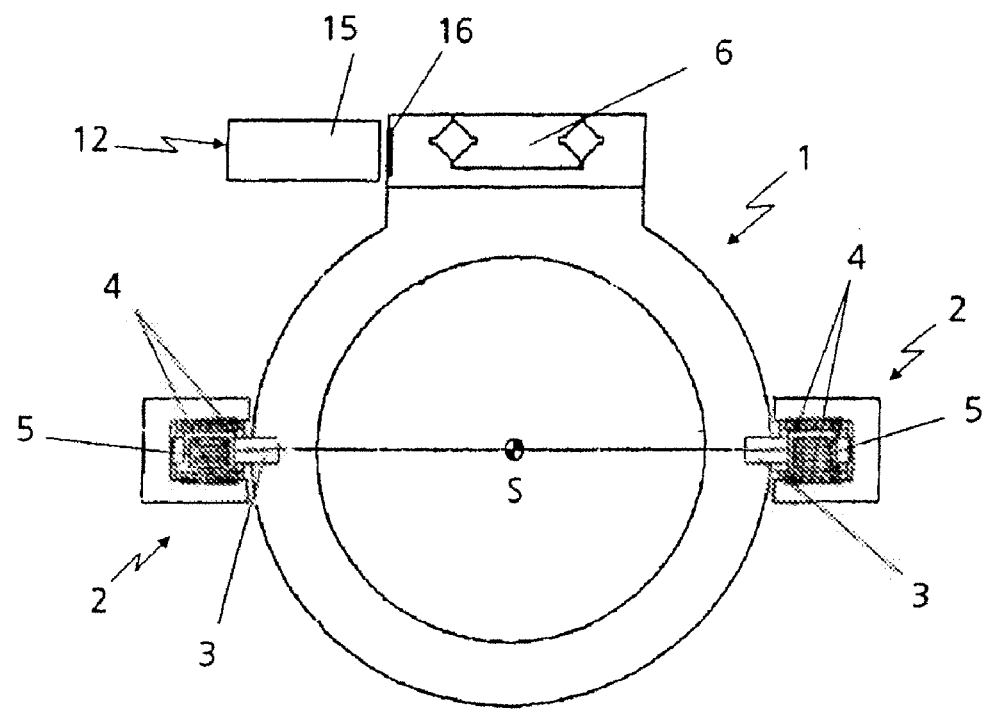
FIG. 2 shows a first variant of the present disclosure.

FIG. 2 shows a variant which differs from FIG. 1 in terms of the concrete configuration of the actuating unit 2. In the variant shown in FIG. 2, in contrast to FIG. 1, the coils 5 rather than the permanent magnets 4 are mechanically connected to the optical component 1, that is to say that the coils 5 concomitantly move with the optical component 1. What is advantageous about this variant is that the coils 5 generally have a smaller mass than the permanent magnets 4, whereby the mass moved in total is reduced. This variant can be expedient for the realization of short adjusting distances, where making electrical contact with the coils 5 via cable connections, for example, is unproblematic.

Figure 2A:
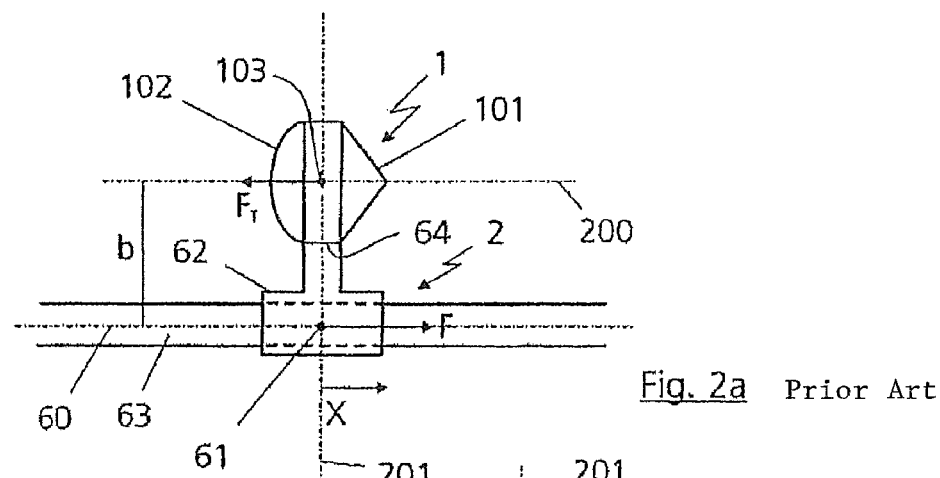
FIG. 2a shows a schematic bearing device for moving an optical element according to the prior art.

In order to illustrate the advantages of the present disclosure, a technical embodiment of an adjustable optical component 1 with an adjusting unit known in the prior art is described schematically referring to FIG. 2a. In this case, the optical component 1 is displaced along an optical axis 200. In order to produce this linear displacement of the optical component 1, an actuating unit is used which moves a slide 62 by a magnitude X along the coordinate axis X, and in this case the optical component 1 moves by substantially the same magnitude X along the optical axis 200. As shown in FIG. 2a, the slide 62 can be guided via a guide 63, wherein the guide axis 60 is substantially parallel to optical axis 200 within mechanical production and alignment tolerances. The optical component 1 illustrated in FIG. 2a is connected to the slide 62 via a connection 64 (not illustrated in more specific detail). The optical component 1 is a refractive element, for example, which can include polyhedral and/or convex or concave surfaces 101, 102. The guide 63 and the slide 62 usually form a driven actuating unit such as can be realized e.g. via the linear actuators described above. In this case, e.g. the slide 62 is moved along the guide 63 via electromagnetic forces. A force F is required for accelerating the slide 62 and the optical component 1, and also for overcoming the friction force of the actuating unit. If the friction force is initially disregarded, then an acceleration a=F/(m+ms) results from the force F taking account of the mass m of the optical component 1. In this case, the mass of the slide 62 is designated by ms. This acceleration brings about an inertial force $F_T$, which acts on the centroid 103 of the optical component 1 and which results as $F_T$=m*a. If the optical component 1 is constructed in such a way that its centroid is displaced along the optical axis 200, then $F_T$ acts along the optical axis 200. It should be mentioned, however, that for the present exemplary embodiment and for the subsequent exemplary embodiments it is not necessarily a requirement that the centroid of the optical component or the centroid of the system of optical components 1 and slide 62 moves along the optical axis 200. The centroids can alternatively also move along an axis displaced parallel to the optical axis 200.

Disregarding possible bearing play of the slide 62 perpendicular to the guide axis 60 of the actuating unit including the guide 63 and the slide 62, and likewise disregarding the geometrical extent of the guide 63 in this direction, e.g. since the distance b between the optical axis 200 and the guide axis 60 is very much greater than the extent of the guide 63, the inertial force $F_T$ generates a torque $M_T$=b*$F_T$ oriented in a direction perpendicular to the guide axis 60. A further torque in this direction can be generated e.g. by the inertial force of the slide 62 if its centroid does not lie on the guide axis 60 of the guide 63.

Figure 2B:
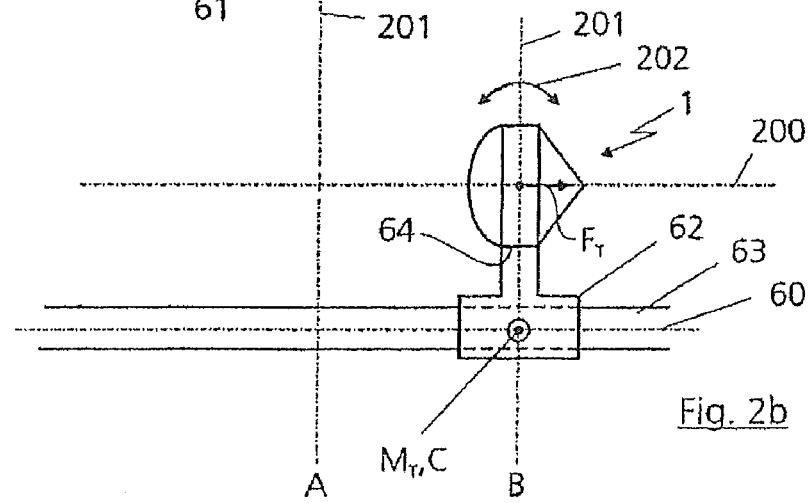
FIG. 2b shows a bearing device according to FIG. 2a with an end position of the optical component and possible oscillations thereof.

The torques generated by the inertial forces dynamically load the guide 63 and the slide 62 (and the optical component 1), such that these elements are excited to effect constrained oscillations as a result of the torque input, or as a result of the forces caused by the torques. If the optical component 1 is transferred from a position A (see FIG. 2a) into an end position B (see FIG. 2b), the deceleration of the optical component 1 on account of its inertial force $F_T$ brings about a torque $M_T$ which brings about excitation to form oscillations mentioned above. The excitation of such oscillations can result in an oscillation 202 of the optical component 1, wherein an imaginary plane 201 through the optical component 1, running perpendicular to the optical axis 200, oscillates about an axis C. The position of this oscillation axis C need not coincide with the position and direction of the torque $M_T$ as shown in FIG. 2b. Rather, the position and the direction of this axis of rotation C depend on the constrained oscillations, wherein the position of the axis of rotation C is substantially determined by the geometry of the guide 63 and of the slide 62 since the effect of the torque $M_T$ is substantially taken up by this guide device 62, 63. In FIGS. 2a and 2b, tilting oscillations are also produced by the torque $M_T$. The tilting oscillations are not damped by the drive device, which can be, for example, a Lorentz linear drive, rather they are predominantly damped by the damping effect of the guide device 62, 63. This damping effect is very small, however, particularly in the case of "frictionless" bearing, which is why, according to the inventors' knowledge, a tilting oscillation excitation by the torque makes a fast precision positioning very difficult or even impossible, as is also explained in more detail below.

In order to position the optical component 1 within less than 500 ms down to less than 50 ms, in modern lithography apparatuses even within 5 ms, to approximately 10 μm down to 1 μm accuracy with respect to the end point B of its displacement, it is necessary for the optical component 1 to reach its end position with as little oscillation as possible with regard to possible oscillations in a direction of the optical axis 200. This is necessary since any oscillation excitation which has an oscillation component 202 in a direction of the optical axis 200 and an amplitude within the range of 1 to 10 μm makes it impossible to position the optical component 1 within the time mentioned. This is owing to the fact that the oscillations 202 usually decay very much more slowly than the time available for positioning the optical component 1 in its end position B, the time being less than 500 ms (e.g., less than 50 ms, less than 5 ms). This relatively slow decay behavior of the constrained oscillations is caused by the fact that the oscillation frequencies are in the range from a few Hz up to a few kHz.

The precision with regard to the actuating accuracy of the optical component 1 relative to its end position B of between 1 and 10 μm within a minimal time within the range of a new ms to 500 ms can advantageously be obtained within a lithographic projection exposure apparatus via the present disclosure, as has already been explained above in connection with FIGS. 1 and 2.

The disclosure therefore includes a lithographic projection exposure apparatus including an optical component that can be moved by a distance along a straight line within a positioning time. In this case, the optical component 1 includes one or a plurality of optical elements 34, which, if appropriate, also have mount elements. The straight line generally furthermore has a polar and azimuth angle of between 0° and 90°. These angles define the direction of the straight line or of the degree of freedom of movement along which the optical component 1 can move. Furthermore, the distance between the straight line and an optical axis is less than a cross-sectional dimension of a projection exposure beam bundle of the projection exposure apparatus. Since the straight line need not necessarily intersect an optical axis within the projection exposure apparatus, since this is dependent on the optical components used, the straight line can also be spaced apart from the optical axis. According to the disclosure, the optical component 1 is guided by a guide unit or guide device (e.g. a linear guide) having a guide direction and is driven via a drive or adjusting unit (actuating unit) having a drive direction via drive forces in such a way that the torques generated by inertial forces of the optical component 1 and of possible components concomitantly moved with the optical component 1, and the torques generated by the drive forces, which act on the guide unit, compensate for one another down to a magnitude of less than 10%. A complete compensation is striven for in this case. However, this depends on the requirements with regard to positioning time and distance to be moved, and also on the technical configuration of the guide unit.

In order to ensure no oscillation excitation of the guide unit as far as possible also at a constant speed of the optical component 1, the drive unit can be configured in such a way that the forces transmitted to the guide unit, in a direction perpendicular to the guide direction, are less than 10% of the drive force in a direction of the straight line or in a direction of movement. Here, too, a best possible avoidance of such forces is striven for, wherein ideally no forces act perpendicular to the guide direction.

In the case of lithographic projection exposure apparatuses, the movable distance of the optical component 1 is between 20 mm and 1000 mm, wherein, as already mentioned, the positioning time is between 5 ms and 500 ms.

As already becomes clear in the previous examples, the guide direction can be arranged, apart from production and alignment tolerances, parallel to the straight line along which the optical component 1 is moved. This requires a stiff and rigid linking of the optical component 1 to the guide unit. Of technical interest are those movements of the optical component 1 which enable a horizontal or vertical displacement. Displacements along an optical axis of the projection exposure apparatus or perpendicular thereto are likewise advantageous. Moreover, it can be advantageous to permit the straight line to intersect the optical axis or to bring it to coincidence therewith.

Figure 2C:
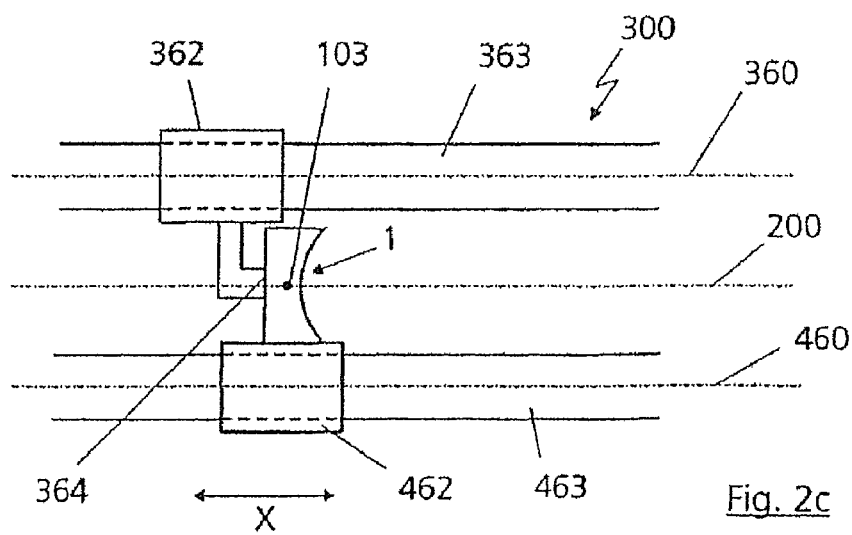
FIG. 2c shows a schematic illustration of a further variant of the present disclosure, with a guide device for guiding the optical component and an actuating unit or drive device, for linearly displacing the optical component.

If the optical component 1 includes for example a rotationally symmetrical optical element, or an optical element 34 which has a rotationally symmetrical effect on the projection exposure beam bundle at least in sections, then the optical component 1 can be optically centered with respect to the straight line along which it moves. In this case, optical centering is understood to mean that e.g. an optical element 34 having the symmetry properties mentioned lies with its point of symmetry on the straight line. FIG. 2c illustrates this, wherein the essential components are only illustrated schematically. In this case, an optical component 1, which has e.g. a reflective surface on a substrate, such as e.g. the concave mirror illustrated in FIG. 2c, is displaced along the optical axis 200 in the X direction. In this case, the optical component 1 having the reflective surface can also be e.g. a diffractive optical element, such as e.g. a reflection grating, but it can also be e.g. a mirror array. In this case, the optical element 1 is guided via the slide 462 and the guide 463, wherein the guide axis 460 of the linear guide 463 is oriented parallel to the optical axis 200 within the scope of the production and alignment tolerances. Furthermore, the guide 463 with its slide 462 has no drive unit serving for the linear drive of the optical component 1. In this case, the guide 463 and the slide 462 can be, for example, an air cushion guide, a magnetic guide, or in the form of a sliding or rolling bearing guide. The optical component 1 is driven via a drive unit 300, which likewise includes a slide 362 and a guide 363. The drive unit 300 can be designed analogously to the adjusting unit illustrated above. The drive unit 300 usually has a drive axis 360 oriented parallel to the guide axis 460 of the guide 463 of the optical element. In this case, the drive unit 300 can be configured e.g. as an electromagnetic linear drive, as has already been described above in connection with the exemplary embodiments of FIGS. 1 to 2b. In this case, the drive slide 362 acts on the optical element in such a way that, via an operative connection 364, the drive forces (accelerating or decelerating forces) pass with their force action line through or substantially through the centroid 103 of the optical component 1. In this case, analogously to the explanations concerning in FIGS. 2a and 2b, the centroid 103 is not necessarily arranged on the optical axis 200, as is illustrated merely by way of example in FIG. 2c. For the case where the drive unit 300 likewise represents a guide for the optical component 1, the latter would be mounted in a statically overdetermined manner, whereby forces and moments would be input onto the optical element. In order to avoid this, a moment decoupling element (not illustrated in FIG. 2c) is advantageously fitted to the operative connection 364, which can include e.g. a ball-and-socket joint on which the drive force acts and from which the drive force is transmitted to the optical component 1.

If the mass ratio between optical component 1 and the mass of the guide slide 462 is such that the mass of the slide 462 is no longer negligible in comparison with the mass of the optical component 1, then the operative connection 364 is chosen such that the force action line of the force applied by the drive unit 300 passes through the overall centroid of optical component 1 and guide slide 462. In this case, possible mount element for the optical component 1, which connect the optical component 1 to the guide slide 462 and hold it in position, are likewise taken into account. Such a directing of the drive force onto the system including optical component 1 and guide slide 462 has the advantage that the drive force and the inertial force caused by the masses of the guide slide 462 and of the optical component 1 upon acceleration (or deceleration) add up to zero, for which reason no torque having a component perpendicular to the optical axis 200 or perpendicular to the guide axis 460 is transmitted to the guide 463 via the guide slide 462. An oscillation excitation of the guide 463 during the movement of the optical component 1 along the optical axis 200 thus fails to occur, thereby enabling the optical component 1 to be rapidly positioned into an end position with extremely high precision.

At very high speeds or accelerations of the optical component 1, a no longer negligible friction force occurs at the guide 463 and at the slide 462, depending on the technical configuration of the guide, which friction force, in the embodiment according to FIG. 2c, can likewise excite the guide 463 to oscillation. This is because as a result of the friction force, which occurs e.g. also at a constant speed of the optical component 1, the drive unit 300 has to counteract this friction force via the operative connection 364 via a force that is correspondingly identical in magnitude but directed in the opposite direction, in order to overcome the friction force $F_R$. This force F applied by the drive unit 300 and introduced via the operative connection 364 brings about a torque $M_R$ in a direction perpendicular to the guide axis 460, as is illustrated schematically in FIG. 2d. In this case, FIG. 2d shows an excerpt from FIG. 2c with the presence of friction forces between guide 463 and slide 462 during constant movement of the optical component 1 along the axis 200, that is to say in arrow direction x. Since the friction also occurs during acceleration, the friction force additionally has to be overcome there as well. This makes it necessary for the drive force that acts on the optical element from the drive unit 300 via the operative connection 364 not only to be predetermined by the necessary acceleration but to be increased by the magnitude of the friction force FR with regard to its magnitude. This increased magnitude of the drive force is not compensated for by the inertial force $F_T$ with regard to the generation of torques. This non-compensated force likewise generates, as illustrated above, a torque perpendicular to the guide axis 460 or perpendicular to the direction of movement, which takes place along the optical axis 200 in the exemplary embodiment shown. This torque can excite the guide 463 of the optical component 1 and hence the slide 462 and the optical component 1 to effect oscillations, thereby preventing a rapid precise positioning.

In the case where virtually speed-independent sliding friction is present, the influence of the friction forces $F_R$ and the influence of the torques $M_R$ associated therewith can be reduced firstly by temporally minimizing the uniform movement of the optical component 1 during the adjustment of the optical component 1 or by completely dispensing with a uniform movement. Secondly, the acceleration can be chosen in such a way that an inertial force $F_T$ acts which is equal to the drive force F reduced by the magnitude of the friction force $F_R$. In addition, the operative connection 364, at which the drive force is introduced onto the optical component 1, between the optical component 1 and the slide 462 is no longer introduced in such a way that the force action line passes through the common centroid thereof, as was mentioned in connection with FIG. 2c. The operative connection 364 is chosen in such a way that the inertial force acting at the common centroid 103 (which results from optical component 1 and the slide 462) and the torque $M_T$ associated therewith precisely compensate for the torque $M_F$ generated by the drive force. Since the inertial force $F_T$ is given and the drive force F is increased by the friction force $F_R$, it is the case that $F_T=F-F_R$ holds true, where $F_T$ is <F, an offset V of the centroid 103 in a direction of the guide axis 460 is necessary for the operative connection 364 in order to obtain the above compensation of the torques $M_T=M_F$. The drive force F is then introduced into the operative connection 364, displaced by the offset V, in such a way that the force action line, instead of passing through the centroid, is displaced by the offset V parallel thereto in a direction of the guide axis 460. This force situation is illustrated schematically in FIG. 2e, which shows the forces occurring in FIG. 2d in relation to the common centroid 103 together with the offset V. In the case of the guides 462, 463 used in projection exposure apparatuses in the course of precise positioning, the friction force is usually very much smaller than 0.001 times the drive force. In the case of aerostatic or magnetic guides, the friction force tends toward zero, such that the offset is very small and often negligible.

On account of the above explanation, the present disclosure encompasses embodiments in which an optical component 1 is guided linearly as precisely as possible via a guide device, and to move the optical component 1 linearly along the device. In this case, via a drive unit 300 or an actuating unit 2, a drive force F is directed into the optical component 1 in such a way that neither forces nor torques having direction components perpendicular to the direction of movement of the optical component 1 input onto the guide 463 by the drive force F. In this case, the direction of movement of the optical component 1 corresponds to the guide axis 460 of the guide 463 apart from production and alignment tolerances. Via this, according to the disclosure, an oscillation excitation of the guide 463 of the optical component 1 (and hence also of the optical element 1) by the drive force F of the drive unit 300 is prevented or at least reduced to an extent such that highly precise linear position changes of the optical component 1 within a very short time in the range of ms, such as, for example, between 5 ms through to 500 ms, are made possible.

In order also to displace or position transparent optical component 1 according to the embodiments described in FIGS. 2c to 2e, the drive-force-transmitting operative connection 364a of the optical component 1 is configured in such a way that e.g. the optical component 1 is connected to the drive unit in each case at an edge region in such a way that a straight line through the edge regions intersects the centroid 103, wherein the straight line can be chosen to be perpendicular to the plane spanned by the optical axis 200 and the guide axis 460. This is illustrated in the exemplary embodiment according to FIG. 2f. This schematically shows a section perpendicular to the direction of movement, which is intended to be identical to the optical axis 200, wherein the optical component 1 (or the optical component) is provided with edge regions 110, 111 at which the drive forces generated by the drive slide 362 of the drive unit 300 with the drive axis 360 is input via a suitable operative connection 364 in the direction of movement. In this case, as mentioned above, the operative connection can include elements which permit a moment decoupling, as is the case e.g. for ball-and-socket joints. The abovementioned straight line is designated by 112 and runs through the common centroid 103 of the optical component 1 and of the slide 462 perpendicular to the spanned plane. In the case of friction in accordance with the embodiments according to FIG. 2d, the straight line has a corresponding offset V according to FIG. 2e and runs in a manner displaced parallel by the offset parallel to the straight line 112 shown in FIG. 2f in a direction of the guide axis 460. In order to avoid a statically overdetermined guide of the optical component 1, a dedicated drive device that acts with its respective drive force on the edge regions 110 and 111 can in each case be provided instead of the drive device 300 with the drive axis 360 (also see FIG. 2c). The drive devices that act on the optical component 1 in such a way are controlled or regulated independently of one another. This embodiment corresponds to the embodiment of the disclosure illustrated in FIG. 1, wherein the drive units have parallel drive directions apart from production and alignment tolerances.

In the context of the knowledge according to the disclosure that in lithography apparatuses a precise and rapid positioning of optical component 1 in accordance with the above explanations necessitates as far as possible avoiding (or minimizing) oscillation excitations of the guides of the optical component 1 by the forces of the drive system, FIG. 2g shows a further embodiment, based on the embodiment of FIGS. 2a and 2b. Guide axis and drive axis coincide here as in the exemplary embodiment according to FIGS. 2a and 2b. In this case, the optical component 1 connected to the slide 62 is guided via the slide in such a way that on account of the length SL of the slide in a direction of the guide axis 60, the oscillation amplitude 202 of the optical component 1 in the direction is reduced, wherein the oscillations essentially result on account of the mechanical play between the guide slide 62 and the guide 63. In this case, the guide slide can be dimensioned in such a way that the oscillation amplitudes that are possible as a result of the bearing play in the region and in the direction of the optical axis 200 is less than L=10 μm. Given a typical bearing play of y=1 μm, this means that for instance y/SL=L/b. In this case, SL is the length of slide 62 and b is the distance between the guide axis 60 and the optical axis 200. By way of example, if b exhibits 50 mm, this results in a length of the slide 62 of SL=5 mm. This means that for the bearing play of 1 μm and the distance b of approximately 50 mm, the slide 62 should have at least a length of 5 mm in order, on account of the mechanical play, to be able to position the optical component 1 within the desired positioning accuracy of better than 10 μm in the region of the optical axis. More generally, the above condition can be formulated in such a way that the guide unit includes a slide guided by a guide and having guide areas spaced apart by a magnitude SL in a guide direction. In this case, the guide and the guide slide have a bearing play y. Furthermore, between an oscillation amplitude L—occurring in a direction of the straight line (along which the optical component 1 moves)—of the optical component 1, which is spaced apart from the guide by the magnitude b, the relationship SL>y*b/L is intended to be complied with. In practice, SL values in the range of 3 to 10 times the distance between the centroid of the optical component 1 and the guide often result in this case, wherein, if the structural space is available, even the 10-fold value can be exceeded, as is explained in more detail below.

The abovementioned condition with regard to the bearing play can be supplemented further by also reducing a reduction of the effect of the torque effects that arise as a result of the inertial force $F_T$, and its effects with regard to constrained oscillations. During deceleration of the optical component 1, the inertial force $F_T$ generates a torque $M_T$, which is compensated for by a torque generated by the force $F_S$, wherein the force $F_S$ acts at least in the vicinity of a slide end. In this case, approximately $F_S* SL=M_T$. These are only approximations since, depending on the configuration of the slide 62 and the guide 63, given the presence of bearing play, the possible axes of rotation about which the slide 62 is induced to rotate on account of the torques caused on account of the inertial forces are not precisely defined. Furthermore, the exact torque condition also depends on the position of the optical element 1 relative to the slide 62. Overall it can be stated, however, that the oscillation excitation of the guide 63 will turn out to be all the smaller, the smaller the force $F_S$ acting on the guide. The force can be reduced by suitable configuration of the length SL of the guide slide 62 to approximately 10% of the inertial force $F_T$ which results during acceleration or deceleration of the optical component 1 (the optical component 1) together with the slide 62. It is thus possible to specify a rough dimensioning rule that can be represented on the basis of a torque equilibrium in the form $F_T* b=F_S*SL=0.1\times F_T* SL$. This permits the determination of SL, wherein SL is then approximately 10* b. In this case, b, as illustrated in FIG. 2g, is the distance between the guide axis 60 and the optical axis 200. The first condition with regard to the bearing play is generally fulfilled via the dimensioning rule. What is disadvantageous about this dimensioning is that in general the slide 62 exceeds the length of 10 cm up to 50 cm, whereby an increased mass is disadvantageously to be moved, which results in an increased drive power. Furthermore, the necessary structural space for this demonstrated inventive solution according to FIG. 2g is often not available.

In a further embodiment of the disclosure, the embodiment according to FIGS. 2a, 2b is modified in such a way that a balancing mass $M_A$ is fitted on a side opposite to the optical component 1 with respect to the guide axis 60, as is indicated schematically in FIG. 2g. The balancing mass $M_A$ is rigidly connected to the slide 62 and chosen with regard to size and distance from the guide axis 60 in such a way that the inertial force proceeding from it during acceleration of the optical component 1 generates a torque in such a way that the torque $M_T$ of the optical component 1 (and possibly of the slide) is precisely compensated for. This means that no resultant torque arises in a direction perpendicular to the guide axis 60 during acceleration or deceleration of the optical component 1. By virtue of this measure, during acceleration of the optical component 1, the guide axis 60 is likewise not excited to effect oscillations, or is at least only excited to effect oscillations to a reduced extent. What is disadvantageous here, too, is that an additional mass has to be moved, which increases the drive power and which requires an additional structural space.

Figures 3A, 3B, 3C:
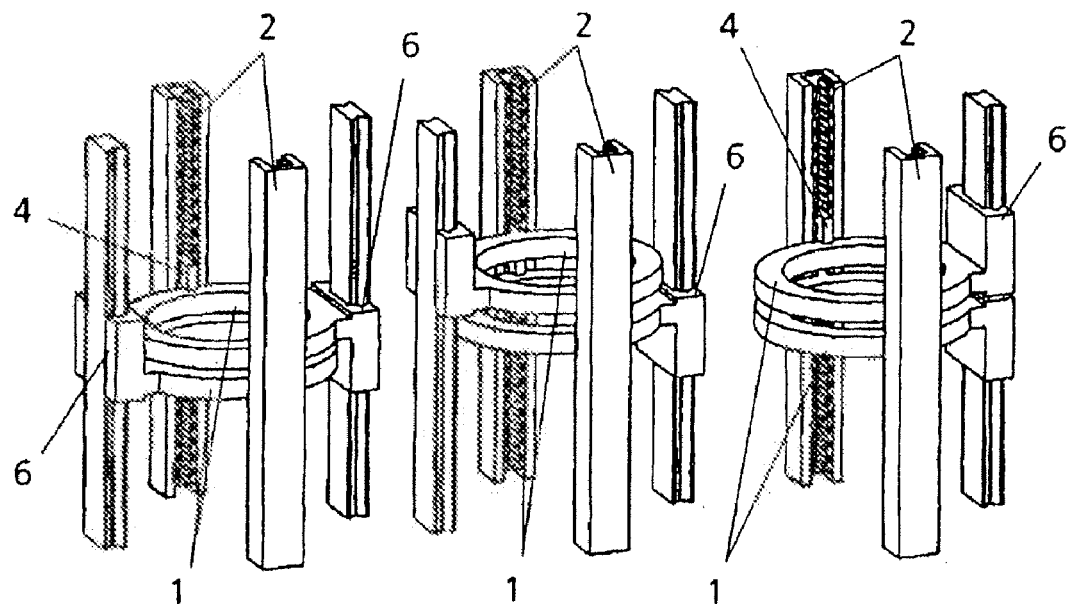
FIGS. 3a-3c show various possibilities for varying the arrangement of optical component, actuating units and linear guide.

FIGS. 3a, 3b and 3c show various possibilities for varying the arrangement of optical component 1, actuating units 2 and linear guide 6. In the variant illustrated in FIG. 3A, the two optical components 1 are in each case guided on dedicated linear guides 6 in a direction of the optical axis, wherein the actuating units 2 serve for the drive, the actuating units being in the form of Lorentz linear actuators in the example shown. In the example shown, the permanent magnet 4 is mechanically connected to the optical component 1 and concomitantly moves with the latter; it goes without saying that a variant in which the coil 5 is mechanically connected to the optical component 1 is also conceivable. In this case, the linear guide 6 can be, for example, a rolling bearing guide, sliding bearing guide, air or magnetic bearing guide.

FIG. 3B shows a variant which is modified by comparison with the arrangement in FIG. 3A and in which the arrangement of the optical components 1 on the linear guides 6 is realized oppositely to the embodiment shown in FIG. 3A, whereby the required structural space can be reduced in the direction orthogonal to the optical axis.

FIG. 3C illustrates a variant in which the two optical components 1 are guided on a common linear guide 6, which likewise results in a reduction of the required structural space. In this case, a magnetic arrangement is used jointly by a plurality of optical components, but each force action point on each optical component 1 can be regulated or controlled completely independently of the other force action points.

In the exemplary embodiments illustrated in FIG. 3, two optical components 1 are moved by the same Lorentz linear actuator as actuating unit 2. A further advantage of the use of a Lorentz linear actuator as actuating unit 2 becomes clear as a result of this: on account of the purely electronic driving, it is possible for two optical components 1 to be moved independently of one another by the same actuator merely via a suitable driving.

Figure 4:
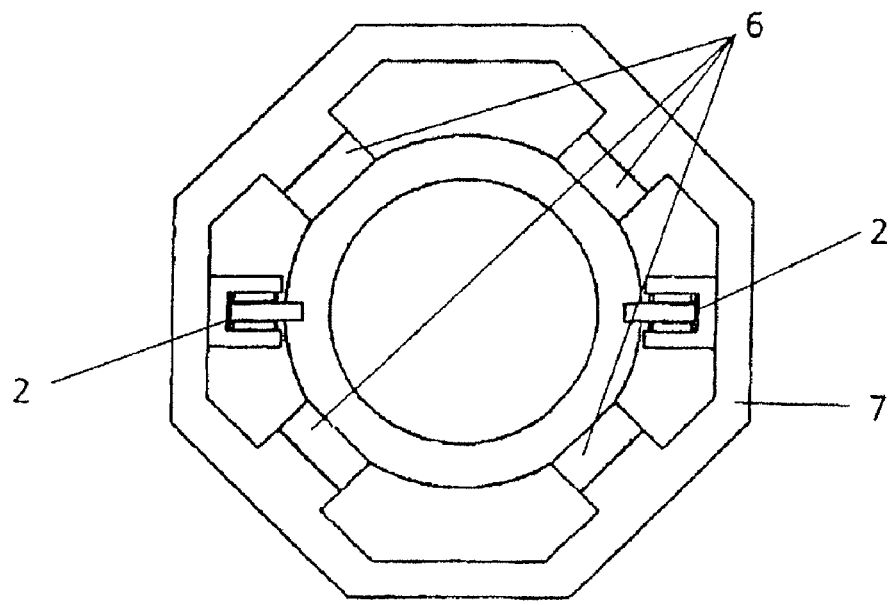
FIG. 4 shows a variant of the disclosure in which the linear guides are realized as air bearings.

FIG. 4 shows, in a section orthogonal to the optical axis, a variant of the disclosure in which the linear guides 6 are realized as air bearings. In this case, the four air bearings 6 are arranged opposite one another respectively in pairs between the two actuating units 2—realized as Lorentz linear actuator—along the inner circumference of the housing 7. The use of air bearings as linear guides 6 has the advantage that a mechanical sliding contact is obviated and a friction of mechanical components against one another is thus precluded. This effectively avoids firstly the desire for lubrication and also the risk of particle abrasion of the mechanical components rubbing against one another. The use of air bearings is thus advantageous particularly in the case of high cycle numbers. As an alternative to the air bearings, it is also possible to use rolling bearings for the linear guide; such ball recirculation or else cross roller guides have the advantage that they can be designed as components having a high stiffness.

Figure 5A:
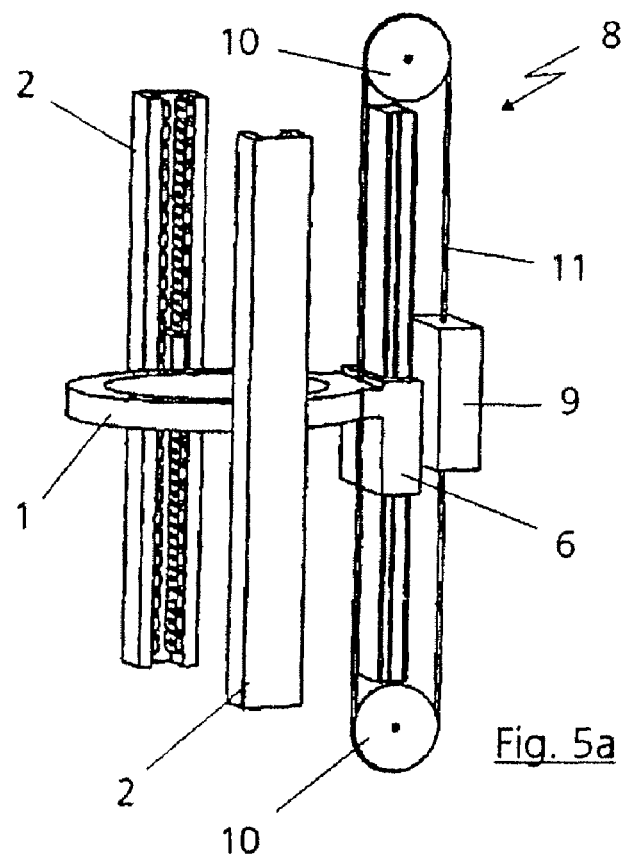
Figure 5B:
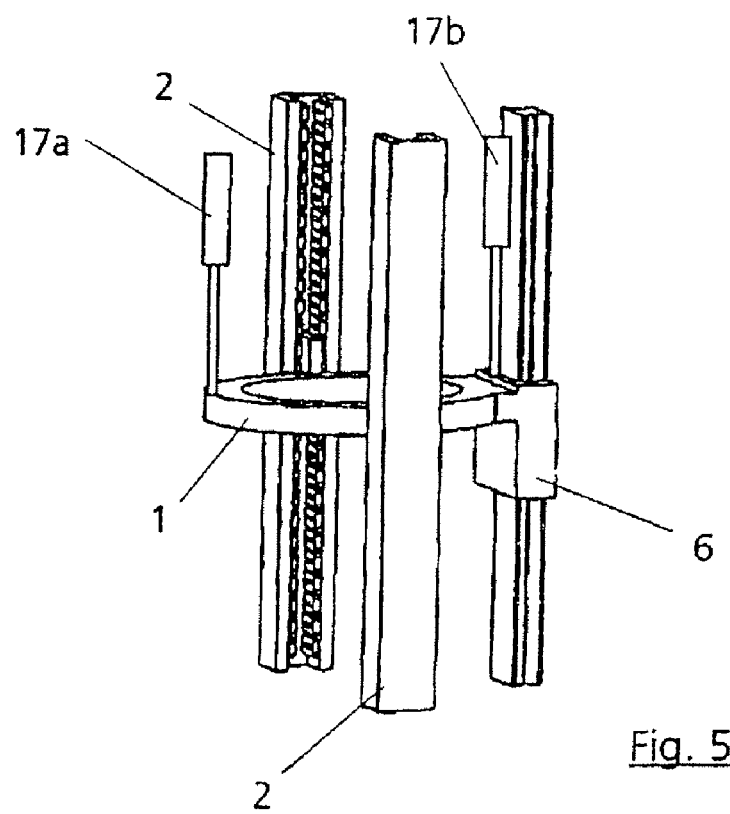

FIGS. 5a and 5b show two embodiments of the device according to the disclosure in which the weight force of the optical component 1 is compensated for. In FIG. 5a this is achieved via the counterweight 9, which acts on the optical component 1 in the region of the linear guide 6 via a cable pull 11 via the deflection rollers 10. FIG. 5b shows the variant wherein the weight force is compensated for by the two pneumatic cylinders 17a and 17b with gap seals. In this case, the two pneumatic cylinders 17a and 17b are arranged on the optical component 1 in such a way that the straight line through the points of action of the two pneumatic cylinders 17a and 17b runs through the centroid of the optical component 1 and, as a result, no additional moments arise at the optical component 1. This variant has the effect that the total mass to be moved during the positioning of the optical component 1 is kept small. The compensation of the weight force of the optical component 1 has the advantage that the actuating units can merely be used to bring the optical component 1 to the desired position as necessary, rather than having to hold the position of the optical component 1 against its entire weight force during operation. The use of the weight force compensation illustrated is appropriate particularly for cases where the optical axis of the optical system and thus the movement axis of the devices lie in a vertical direction. In other words, the actuating unit can be used exclusively for moving the optical component 1 and not for working on it against the gravitational force, which would lead to a considerable heating of the actuating unit 2. If the optical axis and/or the direction of movement of the optical component 1 has a direction deviating from the horizontal, then the weight force resolved by resolution of forces in a direction of the direction of movement and in a perpendicular direction thereto is compensated for in a direction of the direction of movement. This compensation can be effected in accordance with FIGS. 5a and 5b. This affords the advantage that only the inertial forces and friction forces have to be applied for moving the optical element.

Figure 6:
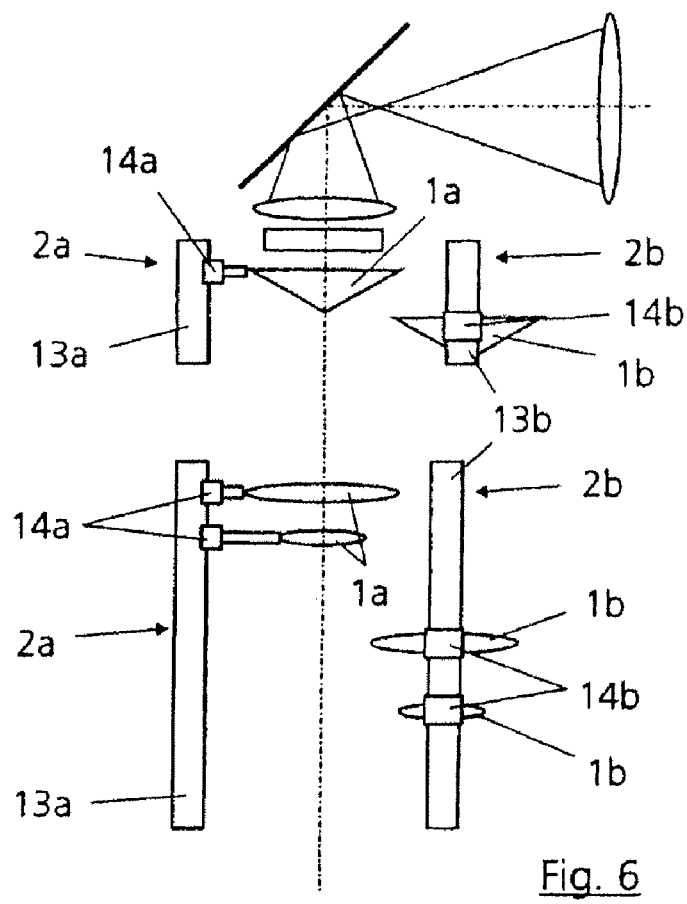
FIG. 6 shows a further embodiment of the device according to the disclosure, in which the optical components, in addition to a displacement in a direction of the optical axis of the optical system, can also be pivoted out of the region of the optical axis or into the region of the optical axis.

FIG. 6 shows a further embodiment of the device according to the disclosure, in which the optical components 1, in addition to a displacement in a direction of the optical axis of the optical system, can also be pivoted out of the region of the optical axis or into the region of the optical axis. For this purpose, the actuating unit 2a is provided with the two axial actuating mechanism 13a and with the pivoting mechanism 14a, by which the abovementioned movements of the optical components 1a can be carried out. The optical system is additionally provided with the actuating mechanism 2b, which, for their part, have the axial actuating mechanism 13b and the pivoting mechanism 14b; in FIG. 6, the optical components 1b connected to the second actuating unit 2b have been pivoted out of the beam path of the optical system and thus out of the optical axis indicated by a dash-dotted line. The embodiment illustrated in FIG. 6 permits the optical properties of the optical system and hence the operational configuration of the optical system to be changed over in an extremely rapid manner. For this purpose, it is merely necessary for the optical components 1a situated in the beam path to be pivoted out of the beam path by the pivoting mechanism 14a and, simultaneously or shortly afterward, for the optical components 1b to be pivoted into the beam path of the optical system using the pivoting mechanism 14b. In this case, the optical components 1b can already be brought into their axial position along the optical axis by the axial actuating mechanism 13b before the pivoting-in process, that is to say still during the operation of the optical system in the first operational configuration, such that this step does not lead to a loss of time when changing over the optical system from one operational configuration to the next. In the example shown, the optical components 1a are merely replaced by the optical components 1b, which are substantially identical to them with regard to their optical properties, at other locations along the optical axis in the optical system. However, the case where the optical components 1 that can be positioned by the actuating units 2a and 2b have different optical properties is also conceivable. In this case, further optical degrees of freedom result for the possible operational configurations of the optical system.

Figure 7:
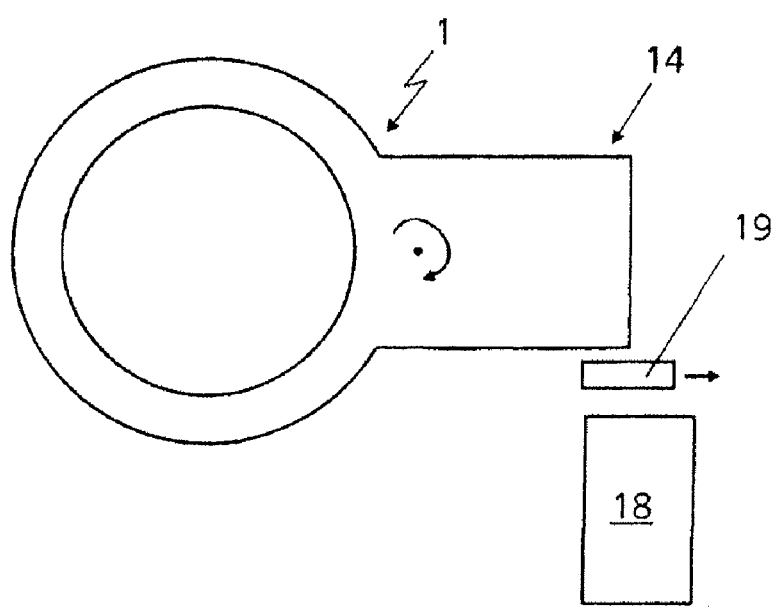
FIG. 7 shows an embodiment of a pivoting mechanism for pivoting the optical component into and out of the beam path of the optical system.

FIG. 7 shows an embodiment of a pivoting mechanism 14, corresponding to the pivoting mechanism 14a, 14b from FIG. 6, for pivoting the optical component 1 into or out of the beam path of the optical system, in which a prestress element 18 and a releasable retention element 19 are provided. In this case, the prestress element 18 is an electromagnet which, upon its activation, has an attracting effect on the magnetizable part of the optical component 1 that faces it. In this case, the rotation of the optical component 1 about the axis indicated by the arrow in the shape of an arc of a circle in FIG. 7 is initially prevented by the releasable retention element 19. At the instant at which the releasable retention element 19 is moved in a direction of the arrow, the optical element 1 is rotated on account of the magnetic attraction force between the electromagnet and the magnetizable part of the optical element 1. A rapid pivoting of the optical component 1 can be ensured in this way. If appropriate, an electromagnet (not illustrated) can likewise be present on the opposite side to the prestress element 18, via which electromagnet the movement of the optical component 1 into its original position can be achieved; a restoring of the of the optical component 1 via a resilient element (likewise not illustrated) is equally conceivable.

Figure 8:
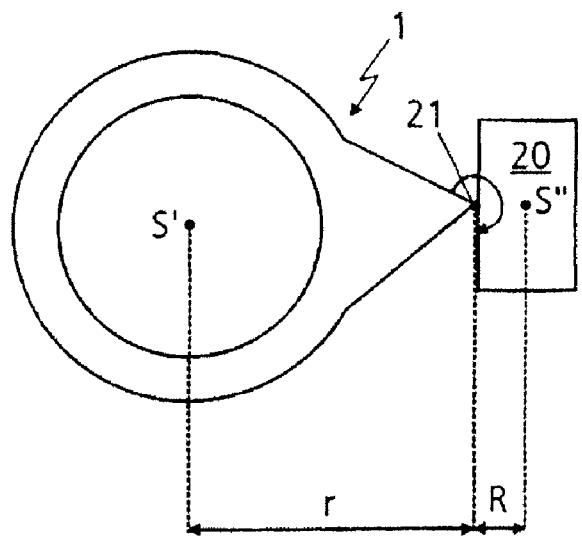
FIG. 8 shows an example of the use of a balancing mass.

FIG. 8 shows a further exemplary embodiment of the disclosure, which takes account of the requirement that, particularly during a rapid pivoting of the optical component 1, as illustrated in FIG. 7, for example, without corresponding countermeasures, parasitic forces/moments such as e.g. transverse forces or tilting moments act on the bearing about which the optical component 1 is pivoted.

Such parasitic forces and/or moments can be effectively minimized, as illustrated in FIG. 8, by the balancing mass 20 being arranged on the opposite side of the optical component 1 with respect to the bearing point 21. In this case, the position of the centroids S' of the optical component 1 and of the centroid S" of the balancing mass 20 with respect to the bearing point 21 are chosen such that the following holds true:

$$\frac{r}{R} = \frac{M}{m}.$$

where
r: distance between the centroid S' of the optical component 1 and the bearing point 21
R: distance between the centroid S" of the balancing mass 20 and the bearing point 21
M: mass of the balancing mass 20
m: mass of the optical component 1.

In this case, the bearing point (21) should be understood as the point at which the plane in which the pivoting/rotation of the centroid S' of the optical component (1) is effected intersects the axis of rotation/pivoting axis. If the above condition is complied with, then the bearing force in a radial direction of the rotation axis upon rotation is minimized in the sense that no centrifugal or centripetal forces occur whose vector sum is not equal to zero, since the axis of rotation of the arrangement passes through the common centroid. This avoids excitation of any oscillations of the axis of rotation as a result of a possible unbalance which, after reaching an end position of the optical component 1, have the effect that the latter performs oscillations about the end position, such that the position of the optical component 1 varies relative to the optical axis or in a direction of the optical axis.

The moment of inertia I of the overall arrangement is calculated as a sum of the two moments of inertia with respect to the bearing point 21 as $$I = mr^2 + MR^2 + I_m + I_M.$$

Substitution leads to $$I = mr^2\left(1 + \frac{R}{r}\right) + 1_m + 1_M.$$

In this case, $I_m + I_M$ are the moments of inertia of the optical component 1 with the mass m and, respectively of the balancing mass M relative to the respective axis of rotation which passes through the respective centroid of the optical component and of the balancing mass, and which run parallel to the abovementioned axis of rotation/pivoting axis through the bearing point 21.

It becomes clear from the relationships illustrated that the variant illustrated in FIG. 8 opens up the possibility, given a suitable choice of R, that is to say of the distance between the balancing mass 20 and the location of the bearing 21, of providing the possibility that, via the use of the balancing weight 20, the parasitic forces on the bearing 31 are largely minimized without the total moment of inertia I of the entire arrangement of optical component 1 and balancing mass 20 assuming such a high value that a rapid pivoting of the arrangement about the bearing point 21 is made excessively more difficult. This is achieved by making the radius of the balancing mass M from the axis of rotation as small as possible, which as a counterpart action means an increase in the balancing mass M. The measure illustrated in FIG. 8 thus has the effect that a subsequent oscillation of the overall arrangement after the rapid pivoting of the optical component 1 into the beam path of the optical system is shortened considerably and the optical system reaches its operational readiness more rapidly after the pivoting. It goes without saying that the use of the balancing mass 20 for reducing parasitic forces in bearing points is not restricted to the variant illustrated in FIG. 8; it is likewise conceivable for the teaching of FIG. 8 also to be applied to the arrangements illustrated in FIGS. 1 to 5, for example as a supporting measure.

Figure 9:
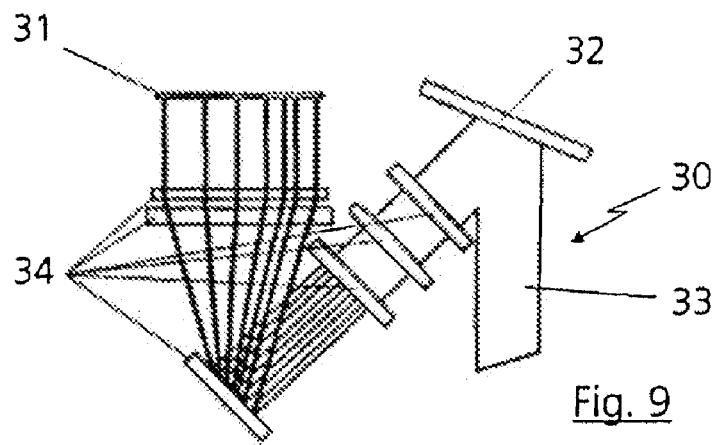
FIG. 9 shows a part of an illumination system of a projection exposure apparatus for semiconductor lithography.

FIG. 9 shows an optical system in which the principles described above can advantageously be employed.

The system described with reference to FIG. 9 is a subsystem 30 of an illumination system of a projection exposure apparatus for semiconductor lithography as far as the first pupil plane 31, which is indicated via the dashed line in FIG. 9. The light distribution—usually referred to as setting—in the pupil plane 31 is set by way of the beam deflection of a previously homogenized and collimated laser beam 33 via a micromirror array (MMA) 32 in a field plane. The other optical elements illustrated in FIG. 9, which are designated in combination by the reference symbol 34, serve for beam shaping on the path of the laser beam 33 from the micromirror array 32 as far as the pupil plane 31; they are not discussed explicitly below.

The method of so-called double exposure, which is widespread in semiconductor lithography, imposes on the illumination system the requirement of changing between two settings within a few milliseconds, such as within the range of 10 to 30 milliseconds. In this case, the frequency of the changes themselves is of a similar order of magnitude. This setting change means that thousands of the micromirrors (not explicitly illustrated in FIG. 9) arranged on the micromirror array 32 have to be adjusted per change of the setting. The associated mechanical loading on the micromirrors leads, particularly in the case of a high number of cycles, to the occurrence increasingly of mechanical failures of individual mirrors or a shortening of the recalibration intervals for the absolute mirror position on account of drift. The objective consists in minimizing the mechanical loading on the individual micromirrors of the micromirror array 32 during the fast setting changes described.

This can be achieved in accordance with the exemplary embodiment illustrated in FIG. 9 by dividing the micromirror array 32 into at least two partial regions. In this case, each partial region of the two regions mentioned contains approximately half of all the micromirrors or, given a subdivision into three partial regions, for example, a third of all the micromirrors, etc. The first partial region is configured, with regard to the position of the individual micromirrors, to the first setting to be chosen, whereas the second partial region, with regard to the arrangement of its micromirrors, is adapted for the second setting. For a change of the setting, in accordance with the exemplary embodiment shown in FIG. 9, the individual micromirrors of the entire micromirror array 32 are now no longer adjusted, rather care is merely taken to ensure that exclusively that partial region of the micromirror array 32 which is respectively adapted to the chosen setting is illuminated. This has the effect that, in the event of a change of the setting, the micromirrors themselves do not have to be moved since only a different illumination of the micromirror array 32 is chosen.

Figure 10:
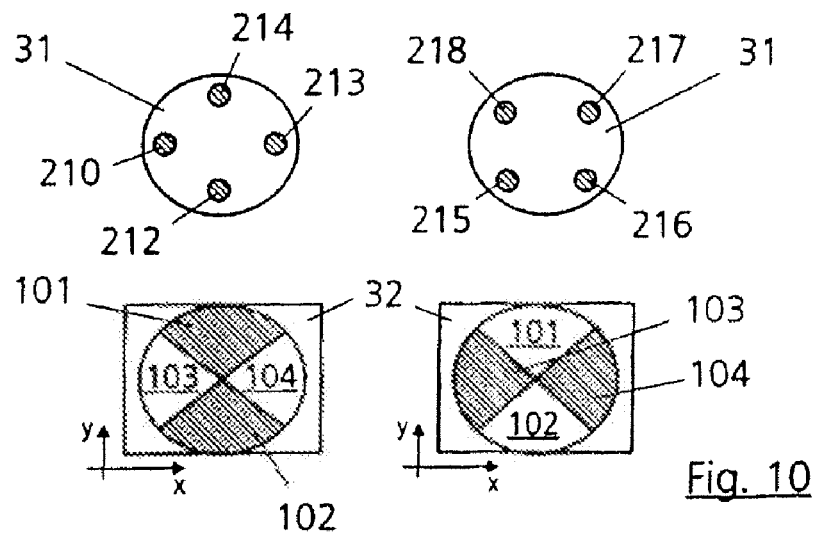
FIG. 10 shows partial regions of a micromirror array and corresponding light distributions in a pupil plane.

FIG. 10 illustrates, in the upper region of the figure, the two light distributions that are set alternately in the pupil plane 31. Setting 1 (left-hand part of FIG. 9a) in this case shows the locations—called poles—having a high light intensity 210, 212, 213 and 214, whereas setting 2 (right-hand part of FIG. 9a) shows the poles 215, 216, 217 and 218.

In the example illustrated in FIG. 10, setting 1 is produced by the beam deflection of the micromirrors lying in the region 101 and 102 of the micromirror array 32, whereas setting 2 is produced by the illumination of the micromirrors of the regions 103 and 104 (cf. lower part of FIG. 9a).

Figure 11A:
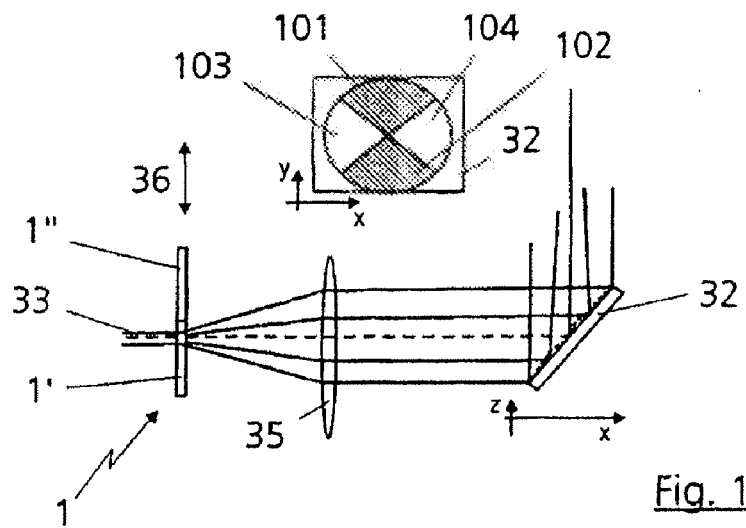
FIGS. 11a-11b show a first possibility for setting a light distribution on a micromirror array.
Figure 11B:
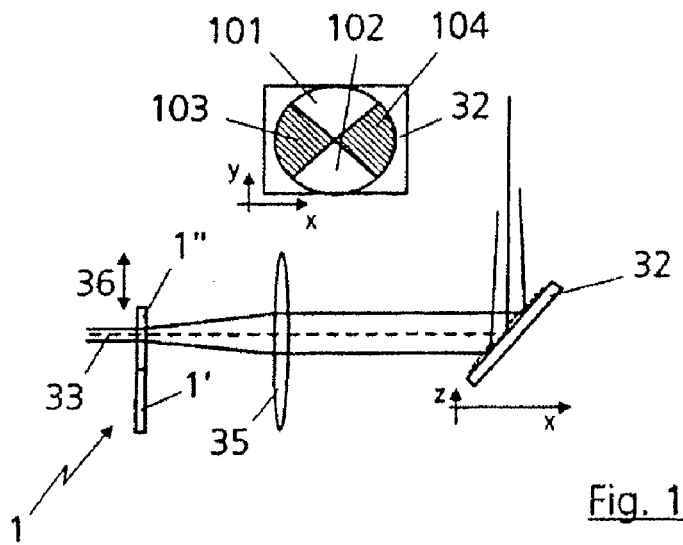

FIGS. 11a and 11b show the arrangement according to the disclosure for setting the light distributions on the micromirror array 32. The optical components 1' and 1" are diffractive optical components in the variant illustrated in subfigures a and b in FIG. 11. It goes without saying that it is likewise possible to use refractive optical components instead of diffractive optical components 1' and 1"; one advantage of this variant is for example because refractive optical components are generally more efficient and cause less scattered light.

By displacing the optical components 1' and 1" in the beam path of the laser beam 33 in a direction of the double-headed arrow 36 in such a way that the optical component 1' or 1" is alternately situated in the beam path of the laser beam 33, what can then be achieved is that the regions 101, 102 (optical component 1') or 103 and 104 (optical component 1") on the micromirror array 32 are alternately illuminated. The lens 35 in the light path between the optical components 1' and 1" and the micromirror array 32 serves for beam shaping in this case.

An essential aspect of the embodiment shown in FIG. 11 is that the micromirror array 32 is arranged in the pupil plane (not designated in FIG. 11) of the lens 35 and the light distribution on the micromirror array 32 is determined by the position or setting of the optical components 1' and 1" in the field plane upstream of the lens 35. In the example illustrated in FIG. 11, the optical components 1' and 1" and also the micromirror array 32 are arranged in a respective focal plane of the lens 35. In this case, it is advantageous if the focal length of the lens 35 has a highest possible value; ranges from 500 millimeters to 100 millimeters can be advantageous here. The described arrangement of lens 35, optical components 1' and 1" and micromirror array 32 has the effect that an approximately collimated illumination on the micromirror array 32 becomes possible, the illumination thus exhibiting little divergence. In this case, the application of the possibilities shown in FIGS. 1 to 8 for rapidly changing the optical component 1 in the beam path of the optical system enable the rapid setting changes striven for; it goes without saying that it is likewise conceivable to apply the teaching of FIGS. 9 and 10 without resorting to the technical solutions illustrated in FIGS. 1 to 8. Assuming that the laser beam 33 exhibits a diameter of approximately 20 millimeters and a switching time of 20 milliseconds is necessary, the speed at which the optical component 1' or 1" has to be moved in the beam path of the laser beam 33 is approximately one meter per second, which represents a value that can perfectly well be controlled in respect of mechanical aspects.

One advantage of the embodiment illustrated in FIGS. 10 and 11 is that the shape of the pupil in the illumination system, in contrast to a procedure according to the prior art, is not set via a for example diffractive optical component without a micromirror array 32, but rather via the micromirror array 32 itself This has the effect that in the extreme case the number of optical components to be kept available can be limited to two, since the micromirror array 32 exhibits the necessary flexibility with regard to the settings to be set. It goes without saying that the arrangement and the geometry of the regions 101 to 104 is not restricted to the form illustrated in FIGS. 9 and 10. In a simplified embodiment, a mirror can be used as the optical component 1, which mirror is shifted to and fro or else tilted in the beam path of the laser beam 33 in order to illuminate the different regions, such as 101 and 102 for example, on the micromirror array 32. This embodiment is depicted schematically in FIG. 12. It goes without saying that the use of prisms, beam deflectors or other optical components is also conceivable.

Figure 13:
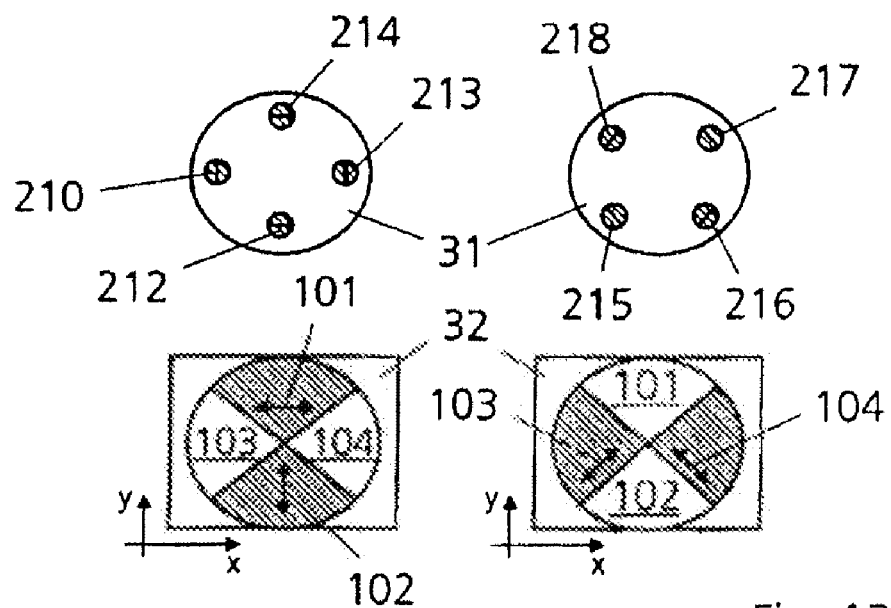
FIG. 13 shows a possibility for selectively choosing the polarization in different regions of the pupil plane.

A subdivision of the regions 101, 102 and/or 103, 104 into subregions having a different polarization enables a change in polarization at the speed discussed above. For this purpose, the polarization in each of the regions mentioned is set by 90° rotators, that is to say optically active plane plates, in the arrangement of a so-called "Schuster plate". The "Schuster plate" includes at least two birifrigent elements having a different orientation of the crystal axes or thicknesses with respect to one another. It utilizes the linear birefringence in order to convert a first polarization distribution into a second polarization distribution varying locally in its profile. A detailed description of the functioning is contained in DE 195 35 392 A1. FIG. 13 shows a possible assignment between the polarization, the partial regions 101, 102, 103, 104 of the micromirror array 32 and the poles of the settings 210, 212, 213, 214, 215, 216, 217, 218 in the pupil plane 31 (cf. FIG. 13). The light linearly polarized in the y direction becomes linearly polarized light in the x direction in the region 101 owing to the use of a 90° rotator (not illustrated) that covers the region 101.

Further rotators in the regions 103 and 104 correspondingly rotate by 45° and −45°, respectively, relative to the orientation of the laser polarization. In this case, in a known manner, the polarization rotation is proportional to the thickness of the optically active substrate of the rotator, whereby different angles of rotation can be realized.

Figure 14:
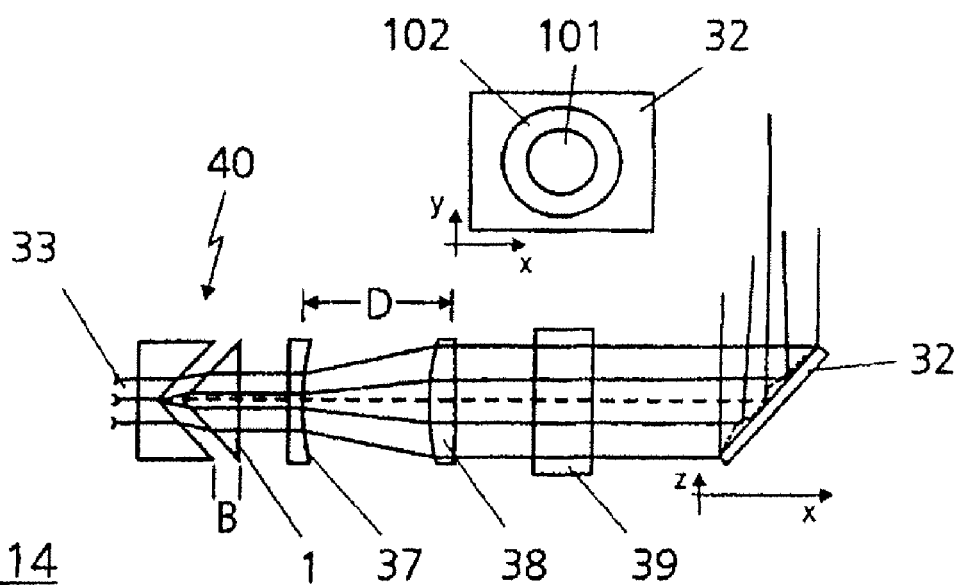
FIG. 14 shows an additional possibility for setting a light distribution on a micromirror array using a so-called axicon.

FIG. 14 shows a further variant, which is suitable for generating rotationally symmetrical light distributions on the micromirror array 32. In this case, the micromirror array 32 is divided into the two regions 101 and 102 having a different functionality. In the example shown in FIG. 13, the optical component 1 is realized as one of the two conical lenses of an axicon 40. The two conical lenses hollow cone in one instance and as cone in one instance and have an identical acute angle. Furthermore, the distance B between the two conical lenses is adjustable. For the case where the two conical lenses are in contact with one another, and the distance B is equal to zero, this results in a light distribution in the form of a circle. Where B is greater than zero, the beam 33 is expanded to the effect that this results in an annular light distribution with a dark field in the center. After passing through the axicon 40, the laser beam 33 impinges on the lens arrangement including the lenses 37, 38 and having a variable distance D, which lens arrangement acts in the manner of a zoom lens and expands the laser beam 33. The neutral filter 39 is arranged in the further course of the light path in a direction of the micromirror array 32. A setting of the distance B between the two conical lenses of the axicon 40 in conjunction with the setting of the distance D between the two lenses 37 and 38 makes it possible to illuminate, alternatively or else jointly, the partial regions 102 and/or 101 on the micromirror array 32. In addition, an arrangement for beam homogenization can be disposed (not illustrated in FIG. 13) in the light path upstream of the axicon 40.

The beam conditioning can be implemented in such a way that any desired light distributions on the micromirror array 32, such as, for example, multipoles, segments or the like, are possible. For this purpose, it is possible, if appropriate, to adapt the geometry of the conical lenses of the axicon 40; a prismatic embodiment of the conical lenses is conceivable, by way of example.

An abaxial illumination of the micromirror array 32 is also possible. For this purpose, the relative orientation between the laser beam 33 and the axicon 40 is changed; by way of example, the position of the laser beam 33 on the axicon 40 is displaced in the z-y plane. This can be effected for example by two tiltable mirrors (not illustrated) disposed upstream of the arrangement. This makes it possible to illuminate only the upper partial region of the micromirror array 32 by a displacement of the laser beam 33 upward (z direction).

Figure 15:
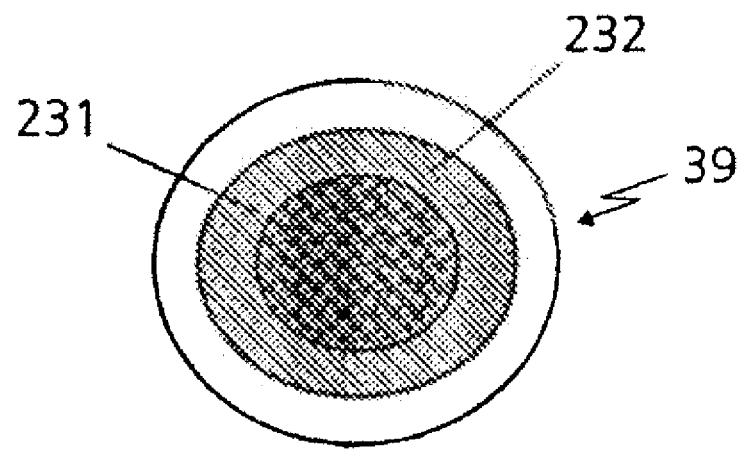
FIG. 15 shows a neutral filter for use in an optical system according to the disclosure.

For intensity correction in the pupil plane 31 already on the plane of the micromirror array 32, it is possible for example to use the neutral filter 39 illustrated in FIG. 15. In the neutral filter 39 shown in FIG. 15, the light is attenuated to a greater extent in the central region 231 than in the peripheral region 232. In this case, the region 231 corresponds to the region 101 on the micromirror array 32, the region 232 corresponding to the partial region 102 on the micromirror array 32. The embodiment of the neutral filter 39 depends on the magnitude of the parameters D and B. Consequently, it will be necessary to introduce different neutral filters 39 into the beam path depending on the setting chosen. In this case, for rapidly changing the neutral filters, it is possible to have recourse to the concepts illustrated with reference to FIGS. 1 to 8.

Figure 12:
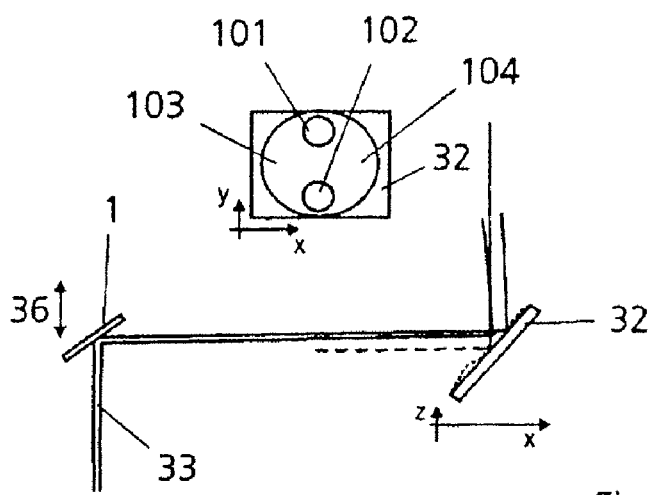
FIG. 12 shows a further possibility for setting a light distribution on a micromirror array.

Correspondingly, the teaching illustrated in FIGS. 1-8 can be employed for the manipulation of the optical components 1, 1', 1" illustrated in FIGS. 11, 12 and 14; a realization independently thereof is likewise possible, of course.

Figure 16:
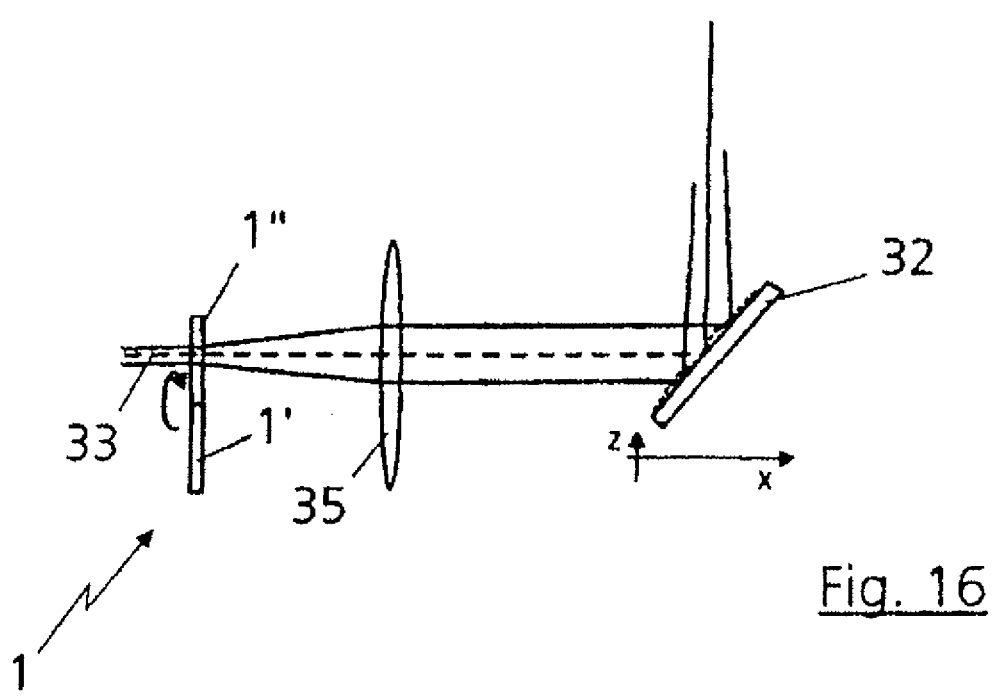
FIG. 16 shows a further possibility for setting a light distribution without linearly accelerated elements.

A further possibility for setting the desired settings, which manages completely without linearly accelerated masses in the system and the inertia effects associated therewith, is described below with reference to FIG. 16: the optical component 1 is accordingly realized as a rotating, for example circular, disk with partial elements 1' 1" as circle sectors. In principle, it suffices to embody the optical component 1 in such a way that it has at least two optical partial elements which can each be introduced periodically at a specific frequency f into a beam bundle used for illumination, such as into the laser beam 33, for example. In the case of the rotating circular disk, the rotational angular frequency $2\pi f$ of the optical component 1 corresponds here for example to the pulse frequency of a laser used for illumination. This has the effect that the light used for illumination is always incident on the same optical partial element 1' or 1" of the rotating optical component 1. When using a CW (continuous wave) laser, the necessary pulses can be generated for example by the use of a periodically operated shutter or a chopper wheel. The choice of the partial element 1' or 1" to be used and thus of the desired setting is effected in this case via the start instant of the sequence of laser pulses used for the respective exposure, of the so-called burst. The essential advantage of this variant is that changing the setting does not require any accelerated linear or rotational movements of optical elements in the light path and thus in the system. This means that no oscillations on account of the inertial forces are input into the system. The setting is chosen purely electronically via the synchronized, temporally controlled choice of the start instant of the respective burst. In order to obtain a temporally stable radiation distribution, it is advantageous if the radiation distribution generated by the partial elements 1' and 1" does not change while the respective partial element 1' or 1" stays in the beam bundle 33, which can be achieved via a corresponding geometrical configuration of the partial element 1' or 1". In order to minimize undesirable effects when the respective partial element 1' or 1" enters into or exits from the beam bundle 33, the length and the start and end instants of the pulses can be chosen in such a way that the entrance and the exit of the respective partial element 1' and 1" is effected during the dark phases between the pulses; in other words, in this case the pulsed beam bundle 33 only ever lies completely on one of the partial elements 1' or 1".

What is claimed is:

1. An apparatus, comprising:
an optical component that can be moved by a distance along a straight line within a time of between 5 ms and 500 ms, the straight line having a polar and azimuth angle of between 0° and 90°, and a distance between the straight line and an optical axis of the apparatus being less than a cross-sectional dimension of a projection exposure beam bundle of the projection exposure apparatus;
a guide unit configured to guide the optical component; and
a drive unit configured to drive the optical component via drive forces so that torques generated by inertial forces of the optical component and of optional components concomitantly moved with the optical component, and the torques generated by the drive forces, which act on the guide unit, compensate for one another to less than 10%,
wherein the apparatus is a lithographic projection exposure apparatus.

2. The apparatus as claimed in claim 1, wherein forces transmitted to the guide unit by the drive unit, in a direction perpendicular to a guide direction, are less than 10% of the drive forces in a direction of the straight line.

3. The apparatus as claimed in claim 1, wherein the torques generated by inertial forces of the optical component and of the optional possible components concomitantly moved with the optical component and the torques generated by the drive forces add up to zero, and wherein the forces in a direction perpendicular to the guide direction are zero.

4. The apparatus as claimed in claim 1, wherein a movable distance of the optical component is between 20 mm and 1000 mm.

5. The apparatus as claimed in claim 1, wherein the guide direction is parallel to the straight line to within production and alignment tolerances.

6. The apparatus as claimed in claim 1, wherein the polar angle is 0° and the straight line is vertical.

7. The apparatus as claimed in claim 1, wherein the polar angle is 90° and the straight line is horizontal.

8. The apparatus as claimed in claim 1, wherein the straight line is vertically parallel to the optical axis of the apparatus.

9. The apparatus as claimed in claim 1, wherein the straight line is vertically perpendicular to the optical axis of the apparatus.

10. The apparatus as claimed in claim 1, wherein the straight line intersects the optical axis of the apparatus.

11. The apparatus as claimed in claim 1, wherein the optical component is optically centered with respect to the straight line.

12. The apparatus as claimed in claim 1, wherein the guide axis and the drive axis coincide.

13. The apparatus as claimed in claim 12, wherein the guide unit comprises a slide guided by a guide and having guide areas spaced apart by a magnitude SL in the guide direction, the guide and the slide have a bearing play y, and, between an oscillation amplitude L—occurring in the direction of the straight line—of the optical component, which is spaced apart from the guide by the magnitude b, the relationship $SL > y*b/L$ is complied with.

14. The apparatus as claimed in claim 13, wherein the magnitude SL of the spaced-apart guide areas have more than three times the distance of the centroid of the optical component with respect to the guide.

15. The apparatus as claimed in claim 13, wherein a balancing mass $M_A$ is arranged on a side opposite to the optical component with respect to the guide axis such that the inertial forces generated by the optical component, the slide and the balancing mass $M_A$ in total no torque perpendicular to the guide direction acts on the guide unit.

16. The apparatus as claimed in claim 13, wherein the guide direction has a parallel offset with respect to the drive direction apart from production and alignment tolerances.

17. The apparatus as claimed in claim 16, wherein the drive forces act on the common centroid of optical component and optional components concomitantly moved with the optical component.

18. The apparatus as claimed in claim 16, wherein the drive forces act on two edge regions of the optical component, and a connecting straight line that connects the edge regions runs through the common centroid of optical component and optional components concomitantly moved with the optical component.

19. The apparatus as claimed in claim 18, wherein the drive forces acting on the edge regions are generated by separately controllable or regulatable drive units with drive directions that are parallel apart from production and alignment tolerances.

20. An apparatus, comprising:
optical component that can be moved by a distance along a straight line, the straight line having a polar and azimuth angle of between 0° and 90°, and a distance between the straight line and an optical axis of the apparatus being less than a cross-sectional dimension of a projection exposure beam bundle of the projection exposure apparatus;
a guide unit configured to guide the optical component, the guide unit having a guide axis; and
a drive unit configured to drive the optical component via drive forces so that torques generated by inertial forces of the optical component and of optional components concomitantly moved with the optical component, and the torques generated by the drive forces, which act on the guide unit, compensate for one another down to a magnitude of less than 10%, the drive unit having a drive axis,
wherein:
the guide axis and the drive axis coincide;
the guide unit comprises a slide guided by a guide and having guide areas spaced apart by a magnitude SL in the guide direction;
the guide and the slide have a bearing play y, and, between an oscillation amplitude L—occurring in the direction of the straight line—of the optical component, which is spaced apart from the guide by the magnitude b;

the relationship SL>y*b/L is complied with;

a balancing mass MA is arranged on a side opposite to the optical component with respect to the guide axis such that the inertial forces generated by the optical component, the slide and the balancing mass MA in total no torque perpendicular to the guide direction acts on the guide unit; and the apparatus is a lithographic projection exposure apparatus.

21. An optical system, comprising:

a plurality of optical components;

an actuating unit configured to position at least one of the plurality of optical components at defined positions along an optical axis of the optical system to set different operational configurations of the optical system, wherein:

the actuating unit acts on the optical component at least one point of action, the actuating unit is configured so that it is possible to change between two different operational configurations within a time period of less than 500 ms, the optical component is mechanically connected to a balancing mass to reduce parasitic forces/moments, the balancing mass has a larger mass than a mass of the optical component, and a distance between a centroid of the balancing mass and a bearing point is less than a distance between the centroid of the optical component and the bearing point, and the optical system is configured to be used in semiconductor lithography.

* * * * *

UNITED STATES PATENT AND TRADEMARK OFFICE
CERTIFICATE OF CORRECTION

| | | |
|---|---|---|
| PATENT NO. | : 8,269,947 B2 | Page 1 of 1 |
| APPLICATION NO. | : 12/372095 | |
| DATED | : September 18, 2012 | |
| INVENTOR(S) | : Frank Melzer et al. | |

It is certified that error appears in the above-identified patent and that said Letters Patent is hereby corrected as shown below:

Column 9, line 10-36, delete "The optical component...the optical axis 200." and insert same as new paragraph at Column 9, Line 11;

Column 11-12, line 34-67, delete "Figure 2c illustrates this,...to the optical component 1." and insert same as new paragraph at Column 11, Line 35;

Column 18, line 8, delete "of the of the" insert --of the--;

Column 18, line 61, delete "$1_m+1_m$" insert --$I_m+I_m$--;

Column 21, line 8, delete "itself" insert --itself.--;

Column 21, line 28, delete "birifrigent" insert --birefringent--;

Column 22, line 54, delete "2 πf" insert --2πf--;

Column 23, line 26, Claim 1, delete "0°and" insert --0° and--;

Column 25, line 4, Claim 20, delete "MA" insert --$M_A$--;

Column 25, line 7, Claim 20, delete "MA" insert --$M_A$--;

Column 26, line 2, Claim 21, after "component" insert --at--.

Signed and Sealed this
Eleventh Day of December, 2012

David J. Kappos
*Director of the United States Patent and Trademark Office*